US009457559B2

(12) United States Patent
Higuchi et al.

(10) Patent No.: US 9,457,559 B2
(45) Date of Patent: Oct. 4, 2016

(54) METHOD OF MAKING SEMICONDUCTOR SUBSTRATE USING AN ETCHING MASK AND METHOD OF MAKING LIQUID EJECTION HEAD SUBSTRATE USING AN ETCHING MASK

(71) Applicant: CANON KABUSHIKI KAISHA, Tokyo (JP)

(72) Inventors: Hiroshi Higuchi, Atsugi (JP); Takayuki Kamimura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/723,312

(22) Filed: May 27, 2015

(65) Prior Publication Data

US 2015/0348791 A1 Dec. 3, 2015

(30) Foreign Application Priority Data

May 30, 2014 (JP) ................................. 2014-112001
Apr. 23, 2015 (JP) ................................. 2015-088301

(51) Int. Cl.
*H01L 21/308* (2006.01)
*H01L 21/3065* (2006.01)
*B41J 2/00* (2006.01)

(52) U.S. Cl.
CPC ....................................... *B41J 2/00* (2013.01)

(58) Field of Classification Search
None
See application file for complete search history.

(56) References Cited

U.S. PATENT DOCUMENTS 6,099,109 A * 8/2000 Komuro .......................... 347/50
2006/0139409 A1* 6/2006 Matsushita .......... B41J 2/14314 347/55
2009/0283871 A1* 11/2009 Chang et al. ................. 257/621
2010/0253743 A1* 10/2010 Takeuchi ................. B41J 2/162 347/47
2012/0028383 A1* 2/2012 Hiramoto ............... B41J 2/1603 438/21
2012/0069094 A1* 3/2012 Okano ................... B41J 2/1603 347/54
2014/0159049 A1* 6/2014 Ko et al. ......................... 257/76

FOREIGN PATENT DOCUMENTS

JP 2004-152967 A 5/2004

* cited by examiner

*Primary Examiner* — Marc Armand
*Assistant Examiner* — Shannon Yi
(74) *Attorney, Agent, or Firm* — Canon U.S.A., Inc. IP Division

(57) ABSTRACT

A method of making a semiconductor substrate having a through-hole includes a step of forming an etching mask on a semiconductor substrate in accordance with a pattern corresponding to the through-hole, and a step of forming the through-hole by etching the semiconductor substrate, on which the etching mask has been formed, by reactive ion etching. At least a part of the pattern corresponding to the through-hole is formed so that the semiconductor substrate is exposed in a frame-like shape along the inner edge of the through-hole.

16 Claims, 16 Drawing Sheets

FIG. 2A−1
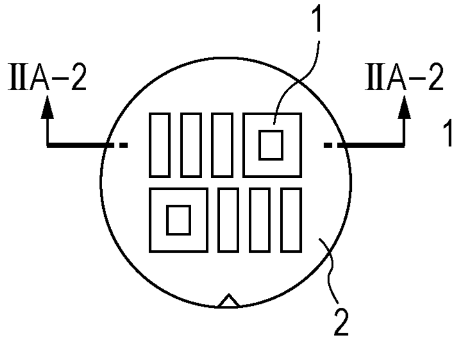
FIG. 2A−2
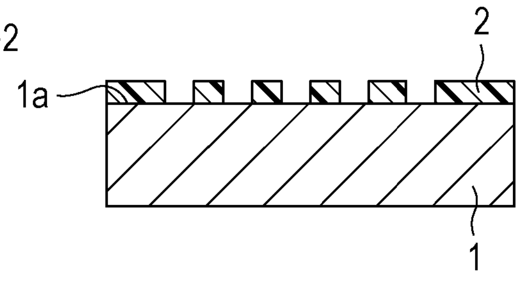
FIG. 2B
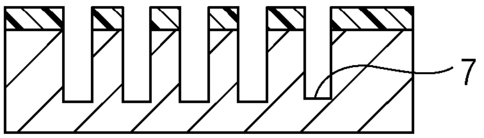
FIG. 2C
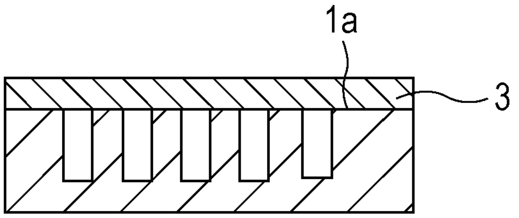

FIG. 6D−1
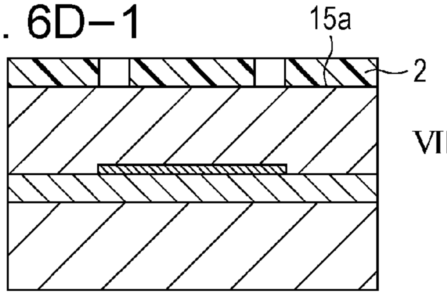
FIG. 6D−2
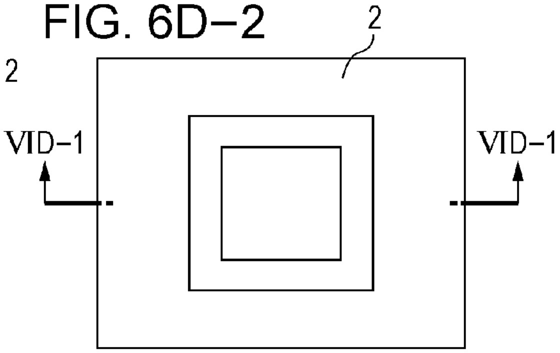
FIG. 6E−1
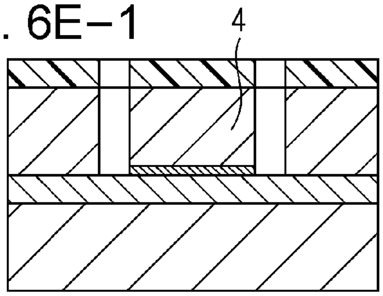
FIG. 6E−2
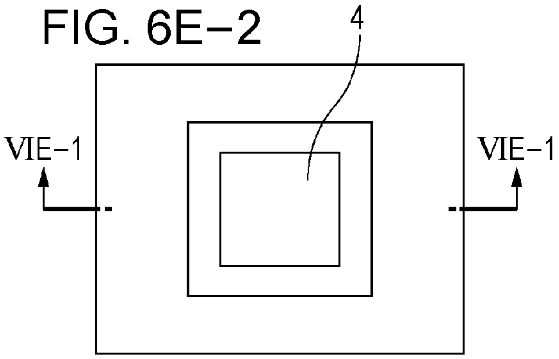
FIG. 6F−1
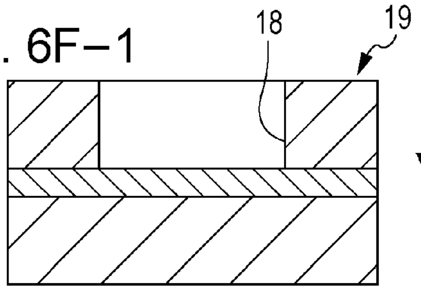
FIG. 6F−2
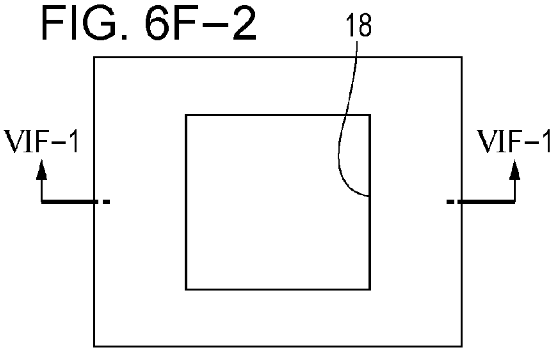

FIG. 12A−1
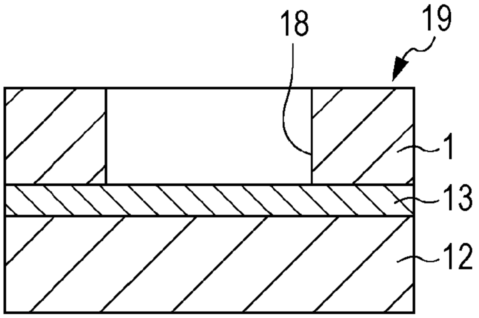
FIG. 12A−2
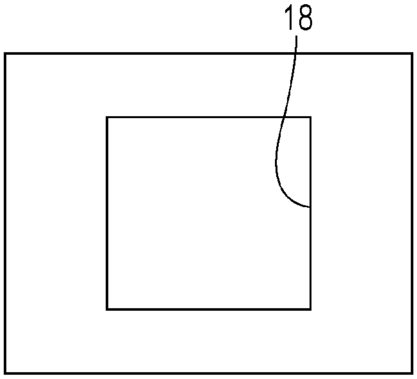
FIG. 12B−1
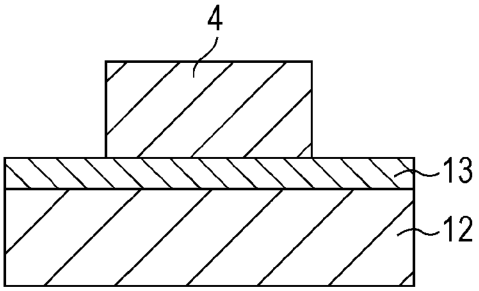
FIG. 12B−2
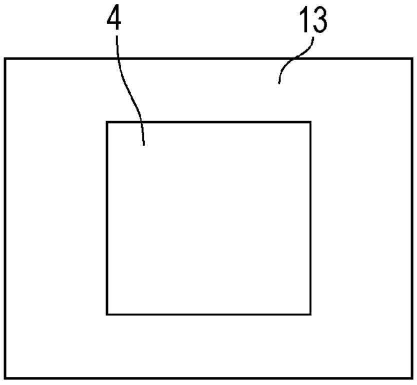

METHOD OF MAKING SEMICONDUCTOR SUBSTRATE USING AN ETCHING MASK AND METHOD OF MAKING LIQUID EJECTION HEAD SUBSTRATE USING AN ETCHING MASK

BACKGROUND

1. Field of the Invention

The disclosure relates to a method of making a semiconductor substrate and a method of making a liquid ejection head substrate.

2. Description of the Related Art

Due to an increasing demand for smaller electronic apparatuses in recent years, reduction in the size and increase in the mounting density of semiconductor device components for electronic apparatuses are in rapid progress. One of methods of mounting semiconductor device components with high density that are attracting attention includes a step of forming via-holes (through-holes) in a silicon substrate on which a circuit has been formed and a step of mounting semiconductor device components three-dimensionally in the silicon substrate.

The through-holes can be formed by using a generally known method, such as dry etching, electrochemical etching, microdrilling, or laser forming. Dry etching is more frequently used than the other methods, because dry etching provides high precision and a high processing rate and because through-holes can be simultaneously formed in a substrate by dry etching. In particular, reactive ion etching (RIE, Deep-RIE), using ions, is usually used, because RIE can process a cross section perpendicular to a substrate surface and can perform high precision processing.

In a reactive ion etching process, a silicon substrate is placed on a stage in an etching apparatus, and through-holes are formed in the silicon substrate by ion etching. In order to prevent damage to the stage after the through-holes have been formed in the silicon substrate and to maintain the pressure of a cooling gas, such as helium, that flows through a space between the stage and the silicon substrate, a protective layer (etching stop layer) may be formed on a surface of the silicon substrate facing the stage.

Through-holes having different sizes may be formed in a silicon substrate, and etching times required for forming the through-holes vary depending on their sizes. Therefore, in order to form through-holes over the entire area of a surface of a silicon substrate without fail, it is necessary to perform over etching (that is, to continue etching after some of the through-holes have been formed).

When over etching is performed, the protective layer is bombarded with ions and becomes charged, so that side etching (etching of side walls of the through-holes), which is also called notching, occurs near an interface between the silicon substrate and the protective layer. Thus, the cross-sectional shapes of through-holes are changed, and the precision of forming the through-holes is reduced. The effect of over etching is larger for through-holes that are etched with higher etching rates. Therefore, the sizes of the through-holes vary across the silicon substrate surface.

Japanese Patent Laid-Open No. 2004-152967 discloses a technology in which an electroconductive metal material is used as a protective layer. With this technology, charging of the protective layer is prevented and notching can be suppressed, because the electroconductive metal material is used as the protective layer.

SUMMARY OF THE INVENTION

Disclosed herein is a method of making a semiconductor substrate having a through-hole including a step of forming an etching mask on a semiconductor substrate in accordance with a pattern corresponding to the through-hole; and a step of forming the through-hole by etching the semiconductor substrate, on which the etching mask has been formed, by reactive ion etching. At least a part of the pattern corresponding to the through-hole is formed so that the semiconductor substrate is exposed with a predetermined line width along an inner edge of the through-hole.

Further features of the present invention will become apparent from the following description of exemplary embodiments with reference to the attached drawings.

BRIEF DESCRIPTION OF THE DRAWINGS

FIGS. 2A-1 to 2G-2 are schematic views illustrating a method of making a semiconductor substrate.

FIGS. 3A-1 to 3G are schematic views illustrating a method of making a semiconductor substrate.

FIGS. 4A-1 to 4E are schematic views illustrating a method of making a semiconductor substrate.

FIGS. 5A-1 to 5G are schematic views illustrating a method of making a semiconductor substrate.

FIGS. 6A to 6F-2 are schematic views illustrating a method of making a semiconductor substrate.

FIGS. 7A to 7E-2 are schematic views illustrating a method of making a semiconductor substrate.

FIGS. 8A to 8D-2 are schematic views illustrating a method of making a semiconductor substrate.

FIGS. 9A to 9E-2 are schematic views illustrating a method of making a semiconductor substrate.

FIGS. 10A to 10D-2 are schematic views illustrating a method of making a semiconductor substrate.

FIGS. 12A-1 to 12B-2 illustrate examples of semiconductor substrates that can be formed by using a method disclosed herein.

DESCRIPTION OF THE EMBODIMENTS

Figures 1, 1A:
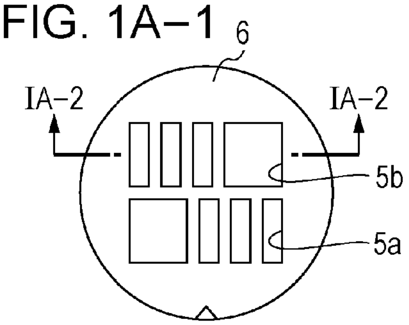
FIGS. 1A-1 to 1E are schematic views illustrating a method of making a semiconductor substrate.

With the method disclosed in Japanese Patent Laid-Open No. 2004-152967, the choice of a metal material that can be used as the protective layer is limited, because etching resistance and ease of forming and removing the protective layer should be taken into consideration. Moreover, in the case of using a metal material as a protective layer, it is necessary to use a vacuum apparatus to form the protective layer. Therefore, Japanese Patent Laid-Open No. 2004-152967 does not provide a simple process for suppressing notches. Furthermore, because the method disclosed in Japanese Patent Laid-Open No. 2004-152967 cannot directly reduce over etching, variation in the sizes of through-holes cannot be sufficiently reduced.

An object of the present invention is to provide a method of making a semiconductor substrate and a method of making a liquid ejection head substrate with which, even when forming a plurality of through-holes having different sizes, notching can be suppressed and variation in the sizes of the through-holes can be reduced through a simple process.

Hereinafter, embodiments of the present disclosure will be described with reference to the drawings. In the following description, the names of substances and materials are used only to illustrate the embodiments of the present invention and do not limit the scope of the present invention.

The conductivity type of a silicon substrate, which is a semiconductor substrate in which a through-hole is to be formed, may be any of p-type, n-type, and i-type. The thickness of the silicon substrate may be, for example, 725 μm, but is not limited to this value.

First, an etching mask is formed on a substrate surface of the silicon substrate. The etching mask may be formed on one of a mirror-finished surface and a satin-finished surface of the silicon substrate or may be formed on each of the mirror-finished surface and the satin-finished surface of the silicon substrate. Any of a positive resist and a negative resist may be used as a resist for forming the etching mask. The etching mask has an appropriate thickness with which the etching mask is not eliminated while forming a through-hole in the silicon substrate by reactive ion etching. The thickness is, for example, 15 μm.

Patterning of the resist is performed by using a projection exposure device, a reduction exposure device, or the like. An etching pattern is transferred to the resist by irradiating the resist with (exposing the resist to) light having a wavelength to which the resist is photosensitive through a reticle having a desired pattern by using any of these devices. Subsequently, development is performed by using an alkali developer or the like, and the etching mask is formed in accordance with the etching pattern.

According the present disclosure, a pattern corresponding to a through-hole is formed so that the silicon substrate is exposed with a predetermined line width along an inner edge of the through-hole. The pattern may be formed so that the silicon substrate is exposed with predetermined line widths along inner edges of all of through-holes or some of the through-holes. The line width, with which the silicon substrate is exposed, may be any appropriate width. The line width may be determined so that the etching rate of the exposed portions is about the same as those of portions that are etched in accordance with other etching patterns. The width may have such a value that the ratios of the etching rates fall within a range of 0.8 to 1.2.

The pattern corresponding to the through-hole may be formed so as overlap an edge portion of a wafer. By doing so, the present invention can be used not only for forming an independent through-hole in the silicon substrate surface but also for forming a through-hole having an opening across the edge of the wafer.

After the etching mask has been formed, reactive ion etching is performed. Reactive ion etching is performed by using a gas and a method that are appropriate for etching a silicon substrate. Typically, etching is performed by deep reactive ion etching (deep RIE) using a sulfur hexafluoride ($SF_6$) gas and a fluorocarbon gas. End point detection can be performed by monitoring emission of light during etching.

When performing reactive ion etching, an etching stop layer may be formed on the silicon substrate. The etching stop layer may be made of a material that is resistant to reactive ion etching. For example, the etching stop layer is formed by applying an adhesive surface of a protective tape to the silicon substrate. A silicon oxide film, a ceramic layer, or a glass substrate may be used as the etching stop layer.

As described above, a pattern corresponding to a through-hole (etching mask) is formed so that the silicon substrate is exposed with a predetermined line width along an inner edge of the through-hole. Therefore, by reactive ion etching, the silicon substrate is etched so that the silicon substrate is exposed with a predetermined line width along the inner edge of the through-hole, and an isolated silicon island, which is isolated from the silicon substrate, is formed inside the etched portion. The isolated silicon island can be removed simultaneously with the etching stop layer. For example, when the protective tape is used as the etching stop layer, the isolated silicon island, which adheres to the adhesive surface of the protective tape, can be also removed by removing the protective tape. By removing the isolated silicon island, the through-hole can be formed.

When reactive ion etching is used to form a hole or a protrusion having a large area, heat generated by etching reaction increases as the etching amount increases. As a result, the property of a resist used as an etching mask may be altered by the heat, and it may become difficult to remove an unused portion of the resist. With the method according to the present invention, the etching amount when forming a hole in a substrate surface or when forming a protrusion on a substrate surface is reduced, so that heat generated during etching is reduced and the resist can be removed easily.

Next, a method of making a liquid ejection head substrate according to the present invention will be described.

The liquid ejection head substrate includes a circuit substrate having a through-hole, a liquid channel, and a liquid ejection port. These elements may be formed in any order. In the example described below, after forming a through-hole in a circuit substrate, a liquid channel and a liquid ejection port are formed in the circuit substrate.

First, a circuit substrate, on which an energy generating element and a circuit for ejecting a liquid are mounted and which has a through-hole, is prepared. The circuit substrate, having the through-hole, can be formed by using the aforementioned method of forming a through-hole. However, it is necessary to perform appropriate preprocessing in accordance with the structure of the circuit substrate. For example, if the circuit substrate has a protective film, such as a silicon-based inorganic film, the through-hole is formed after removing a portion of the protective film corresponding to the through-hole by performing reactive ion etching using a fluorocarbon gas or wet etching using an etching liquid including hydrogen fluoride or the like.

Next, a liquid channel is formed in the circuit substrate in which the through-hole has been formed. A method of forming the liquid channel is not particularly limited. For example, a resist film is applied to the circuit substrate, and a desired liquid channel pattern is formed by exposing the circuit substrate to light. Any of a positive resist and a negative resist made of a material that does not swell by absorbing a liquid may be used. The liquid channel may be formed by using a ceramic material, such as alumina (aluminum (III) oxide) or titanium (titanium dioxide); a silicon-based inorganic film, such as a silicon nitride film; or a metal material, such as a stainless steel. Even when forming the liquid channel by using such a material, a desired liquid channel pattern can be formed by performing photolithography using a resist. The height of the liquid channel (film thickness) may be set to be any appropriate value. Typically, the height is in the range of about 0.1 μm to 100 μm.

Next, a liquid ejection port is formed. The liquid ejection port can be formed in the same way as forming the liquid channel. The height of the liquid ejection port (film thickness) may be set to be any appropriate value. Typically, the height is in the range of about 0.1 μm to 100 μm. For example, the liquid ejection head substrate may be made by affixing liquid a channel and a liquid ejection port that have been formed through a different process to the circuit substrate.

As described above, according to the present embodiment, an etching mask is formed on a substrate so that the substrate is exposed with a predetermined line width along an inner edge of a through-hole, and reactive ion etching is performed. The exposed portion of the substrate is etched away by reactive ion etching and the inside of the etched portion becomes isolated from the substrate. Therefore, the through-hole can be formed by removing the isolated portion. Accordingly, the etching time for forming the through-hole depends on the line width with which the substrate is exposed along the inner edge of the through-hole. Therefore, by forming a plurality of through-holes having different sizes in the substrate with predetermined line widths, the differences between the times required for forming the through-holes having different sizes can be reduced.

Therefore, over etching can be reduced, so that notching can be suppressed and variation in the sizes of the through-holes can be reduced. Moreover, because it is not necessary to use a metal material as a protective layer, notching can be suppressed and variation in the sizes of the through-holes can be reduced through a simple process.

Hereinafter, specific examples of a method of making a semiconductor substrate and a method of making a liquid ejection head substrate according to the present invention will be described.

First Embodiment

Figures 1, 1A, 2:
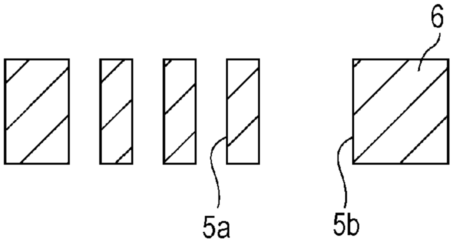
Figures 1, 1B:
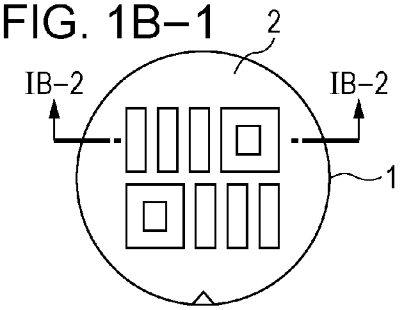
Figures 1, 1B, 2:
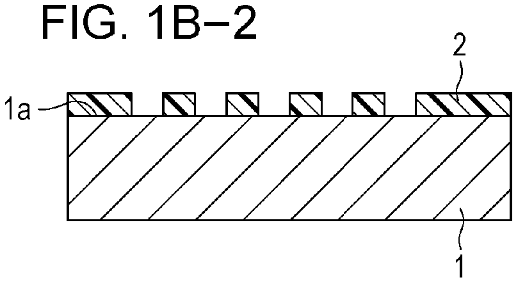
Figure 1C:
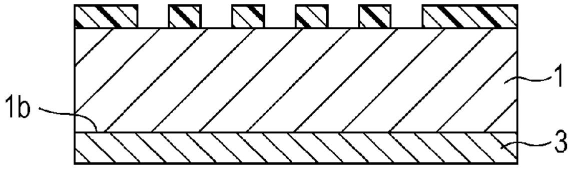
Figures 1, 1D:
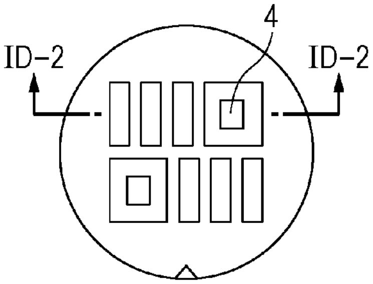
Figures 1, 1D, 2:
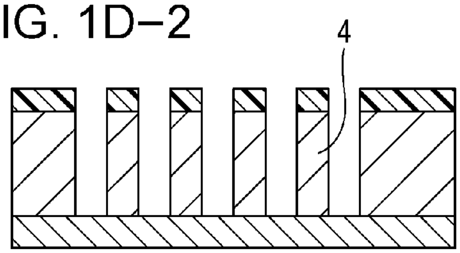
Figure 1E:
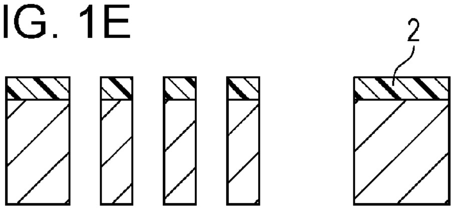

FIGS. 1A-1 to 1E are schematic views illustrating a method of making a semiconductor substrate according to a first embodiment of the present invention. In the following example, a method of making a semiconductor substrate 6 (FIGS. 1A-1 and 1A-2) that has a plurality of through-holes 5*a*, each having a size of 200 μm×600 μm, and a plurality of through-holes 5*b*, each having a size of 600 μm×600 μm, will be described. FIGS. 1A-1, 1B-1, and 1D-1 are plan views, and FIGS. 1A-2, 1B-2, 1D-2, and 1E are sectional views. In particular, FIG. 1A-2 is a sectional view taken along line IA-2-IA-2 in FIG. 1A-1.

First, a silicon substrate 1 is prepared. The thickness of the silicon substrate 1 is, for example, 725 μm. Next, an adhesion enhancing layer (not shown) is made by applying hexamethyldisilazane (HMDS) to a mirror-finished surface 1*a* of the silicon substrate 1. Subsequently, a positive resist is applied by spin coating so as to have a thickness of 10 μm. Next, i-line exposure is performed through a photomask. At this time, regions corresponding to the through-holes 5*a* are exposed to light with the same sizes as the through-holes 5*a*. Regions corresponding to the through-holes 5*b* are exposed to light so that the silicon substrate 1 is exposed with a predetermined line width along the inner edges of the through-holes 5*b*. The line width is the same as the length of the short side (200 μm) of each of the through-holes 5*a*. The through-hole 5*b* is quadrangular. Therefore, the portions of the silicon substrate exposed along the inner edges of the through-holes 5*b* have frame-like shapes along the four inner edges of the through-holes 5*b*.

Next, development is performed by using an alkali developer including tetramethylammonium hydroxide (TMAH).

Through the process described above, an etching mask 2 is formed on a mirror-finished surface 1*a* of the silicon substrate 1. To be specific, the etching mask 2 is formed so that portions of the silicon substrate corresponding to the through-holes 5*a* are exposed in frame-like shapes along the inner edges of the through-holes 5*b* (FIGS. 1B-1 and 1B-2). FIG. 1B-2 is a sectional view taken along line IB-2-IB-2 in FIG. 1B-1.

After the step of forming the etching mask 2, an etching stop layer 3 is formed (FIG. 1C) by applying an adhesive protective tape to a satin-finished surface 1*b* of the silicon substrate 1.

Next, through-holes are formed in the silicon substrate 1 by etching away portions of the silicon substrate 1 corresponding to the through-holes by performing reactive ion etching using a sulfur hexafluoride gas and a fluorocarbon gas from a surface on which the etching mask 2 is formed.

The portions of the silicon substrate 1 corresponding to the through-holes 5*a* are etched away in about 60 minutes, and the portions of the silicon substrate 1 exposed in frame-like shapes along the inner edges of the through-holes 5*b* are etched away in about 63 minutes. Thus, there is only a small difference between the time required for etching away the portions corresponding to the through-holes 5*a* and the time required for etching away the portions corresponding to the through-holes 5*b* and exposed in frame-like shapes along the inner edges of the through-holes 5*b*. Inside the portions etched in frame-like shapes, isolated silicon islands 4, which are isolated from the silicon substrate 1 and supported by a protective tape, which is the etching stop layer 3, are formed (FIGS. 1D-1 and 1D-2). FIG. 1D-2 is a sectional view taken along line ID-2-ID-2 in FIG. 1D-1.

Next, from the silicon substrate 1 that has been etched, the protective tape, which is the etching stop layer 3, is thermally released from the silicon substrate 1. By removing the protective tape, the isolated silicon islands 4 are also removed (FIG. 1E). Next, the etching mask 2 is removed. Thus, the semiconductor substrate 6 having the through-holes 5*a* and 5*b* is formed (FIGS. 1A-1 and 1A-2).

As described above, there is only a small difference between the time required for etching away the portions of the silicon substrate corresponding to the through-holes 5*a* and the time required for etching away the portions of the silicon substrate exposed in frame-like shapes along the inner edges of the through-holes 5*b*. The isolated silicon islands 4 are formed by etching away the portions of the silicon substrate exposed in frame-like shapes, and the through-holes 5*b* are formed by removing the isolated silicon islands 4. Accordingly, there is only a small difference between the times required for forming the through-holes 5*a* and 5*b*.

Therefore, over etching can be reduced, and hence notching can be suppressed and variation in the sizes of the through-holes can be reduced. Moreover, because it is not necessary to use a metal material as a protective layer, notching can be suppressed and variation in the sizes of the through-holes can be reduced through a simple process.

Next, a method of making a liquid ejection head substrate according to the present embodiment will be described. In the following example, a method of making a liquid ejection head substrate that has a plurality of through-holes, each having a size of 200 μm×600 μm, and a plurality of through-holes, each having a size of 600 μm×600 μm, will be described.

First, a circuit substrate is prepared. Next, a positive resist mask is formed on a surface of the circuit substrate on which a circuit has been formed, so that the circuit substrate is exposed in frame-like shapes along the inner edges of the through-holes. Next, reactive ion etching is performed by using $CF_4$ gas, and portions of a SiN protective layer corresponding to through-holes are removed so that openings are formed, and the resist mask is removed. Next, the through-holes are formed in the circuit substrate in the same way as described above with reference to FIGS. 1A-1 to 1E.

Next, a negative resist having a thickness of 5 μm is applied to a surface of the circuit substrate on which the circuit is mounted while heating the negative resist to 70° C. Subsequently, a liquid channel is formed by performing exposure to light in a pattern of the liquid channel and by performing development using an alkali developer.

Next, a negative resist made of a material the same as that of the liquid channel and having a thickness of 10 μm is applied to the liquid channel while heating the negative resist to 70° C. Subsequently, a liquid ejection port is formed by performing exposure to light in a pattern of the liquid ejection port and by performing development using an alkali developer. Subsequently, a liquid ejection head substrate is made by heating the substrate at 200° C. for 30 minutes in an oven.

With the method of making a liquid ejection head substrate described above, the difference between the times required for etching large through-holes and small through-holes can be reduced. Therefore, over etching can be reduced. Accordingly, even when forming a plurality of through-holes in the circuit substrate, notching can be suppressed and variation in the sizes of the through-holes can be reduced. Moreover, because it is not necessary to use a metal material as a protective layer, notching can be suppressed and variation in the sizes of the through-holes can be reduced through a simple process.

Second Embodiment

FIGS. 2A-1 to 2G-2 are schematic views illustrating a method of making a semiconductor substrate according to a second embodiment of the present invention.

Figures 1, 2D:
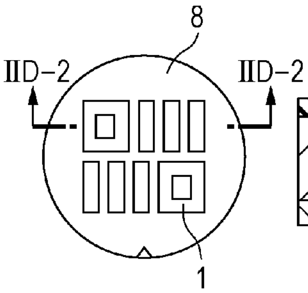
Figures 2, 2D:
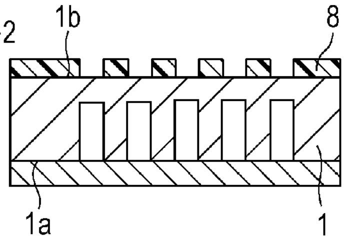

First, in the same way as in the first embodiment, the etching mask 2 (first etching mask) is formed on a mirror-finished surface 1*a* of a silicon substrate 1 (first surface) (FIGS. 2A-1 and 2A-2). FIGS. 2A-1 and 2D-1 are plan views, and FIGS. 2A-2, 2B, 2C, 2D-2, 2D-3, 2E-1, 2E-2, 2F-1, 2F-2, 2G-1, and 2G-2 are sectional views. In particular, FIG. 2A-2 is a sectional view taken along line IIA-2-IIA-2 in FIG. 2A-1.

Next, grooves 7 are formed in the silicon substrate 1 by performing reactive ion etching for 40 minutes by using a sulfur hexafluoride gas and a fluorocarbon gas from a surface on which the etching mask 2 is formed (FIG. 2B). The average depth of the grooves 7 is 450 μm.

Next, the etching mask 2 is removed, and the etching stop layer 3 is formed by applying an adhesive protective tape to a mirror-finished surface 1*a*, in which the grooves 7 have been formed (FIG. 2C).

Next, an adhesion enhancing layer (not shown) is made by applying hexamethyldisilazane (HMDS) to the satin-finished surface 1*b* (second surface) of the silicon substrate 1 opposite to the mirror-finished surface 1*a*. Subsequently, a positive resist is applied by spin coating so as to have a thickness of 10 μm. Subsequently, a second etching mask 8, which has a pattern reverse to that of the etching mask 2, is formed by performing i-line exposure and development using an alkali developer (FIGS. 2D-1 and 2D-2). FIG. 2D-2 is a sectional view taken along line IID-2-IID-2 in FIG. 2D-1.

Next, through-holes are formed in the silicon substrate 1 by etching away portions of the silicon substrate 1 connected to the grooves 7 by performing reactive ion etching using a sulfur hexafluoride gas and a fluorocarbon gas from a surface on which the second etching mask 8 is formed. The time required for etching away the portions of the silicon substrate 1 corresponding to the through-holes 5*a* is about 20 minutes, and the time required for etching away the portions corresponding to the through-holes 5*b* is about 23 minutes. Thus, there is only a small difference between the time required for etching away the portions corresponding to the through-holes 5*a* and the time required for etching away the portions exposed in frame-like shapes along the inner edges of the through-holes 5*b*.

Figures 2, 2D, 3:
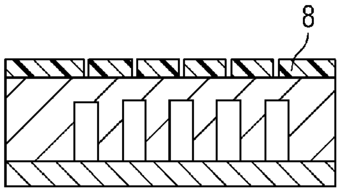
Figures 1, 2E:
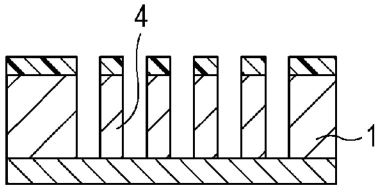
Figures 2, 2E:
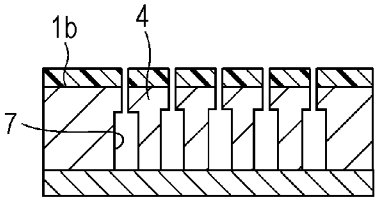

Inside the portions etched in frame-like shapes, isolated silicon islands 4, which are isolated from the silicon substrate 1 and supported by a protective tape, which is the etching stop layer 3, are formed (FIG. 2E-1).

Figures 1, 2F:
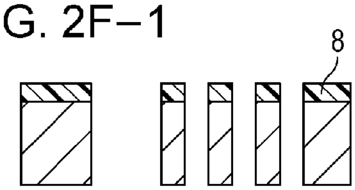
Figures 2, 2F:
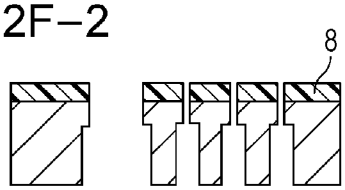
Figures 1, 2G:
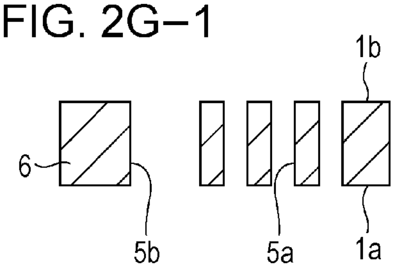
Figures 2, 2G:
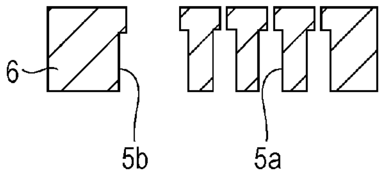

Next, from the silicon substrate 1, which has been etched, the protective tape, which is the etching stop layer 3, is thermally released from the silicon substrate 1. By removing the protective tape, the isolated silicon islands 4 are also removed (FIG. 2F-1). Next, the second etching mask 8 is removed. Thus, a semiconductor substrate 6 having the through-holes 5*a* and 5*b* is formed (FIG. 2G-1).

As described above, there is only a small difference between the time required for etching away the portions of the silicon substrate corresponding to the through-holes 5*a* and the time required for etching away the portions of the silicon substrate exposed in frame-like shapes along the inner edges of the through-holes 5*b*. The isolated silicon islands 4 are formed by etching away the portions of the silicon substrate exposed in frame-like shapes, and the through-holes 5*b* are formed by removing the isolated silicon islands 4. Accordingly, there is only a small difference between the times required for forming the through-holes 5*a* and 5*b*.

Therefore, over etching can be reduced, and hence notching can be suppressed and variation in the sizes of the through-holes can be reduced. Moreover, because it is not necessary to use a metal material as a protective layer, notching can be suppressed and variation in the sizes of the through-holes can be reduced through a simple process.

In the present embodiment, the second etching mask 8 may have a pattern that is reverse to that of the etching mask 2 and that has a line width smaller than that of the etching mask 2 (FIG. 2D-3). By performing reactive ion etching from a surface on which the second etching mask 8, having a smaller line width, is formed, grooves having a width smaller than that of the grooves 7 are formed in the satin-finished surface 1*b*. When these grooves are connected to the grooves 7, through-holes are formed in the silicon substrate 1. Through the process described above, isolated silicon islands 4 are formed inside the portions of the silicon substrate 1 etched in frame-like shapes (FIG. 2E-2).

Next, from the silicon substrate 1, which has been etched, the protective tape, which is the etching stop layer 3, is thermally released from the silicon substrate 1. By removing the protective tape, the isolated silicon islands 4 are also removed (FIG. 2F-2). Next, the second etching mask 8 is removed. Thus, a semiconductor substrate 6 having the through-holes 5*a* and 5*b* is formed. Each of the through-holes 5*a* and 5*b* has two portions having different widths (FIG. 2G-2).

Next, a method of making a liquid ejection head substrate according to the present embodiment will be described.

First, a circuit substrate is prepared. Next, portions of a SiN protective layer corresponding to through-holes are removed in the same way as in the first embodiment. Next, through-holes are formed in the circuit substrate in the same way as described above with reference to FIGS. 2A-1 to 2G-2. The etching mask 2 is formed on a surface of the circuit substrate on which a circuit is not formed, and the second etching mask 8 is formed on the surface on which the circuit is formed.

Next, a liquid ejection head substrate is formed by forming a liquid channel and a liquid ejection port in the same way as in the first embodiment.

With the method of making a liquid ejection head substrate described above, the difference between the times required for etching large through-holes and small through-holes can be reduced. Therefore, over etching can be reduced. Accordingly, even when forming a plurality of through-holes in the circuit substrate, notching can be suppressed and variation in the sizes of the through-holes can be reduced. Moreover, because it is not necessary to use a metal material as a protective layer, notching can be suppressed and variation in the sizes of the through-holes can be reduced through a simple process.

Third Embodiment

Figures 1, 3A:
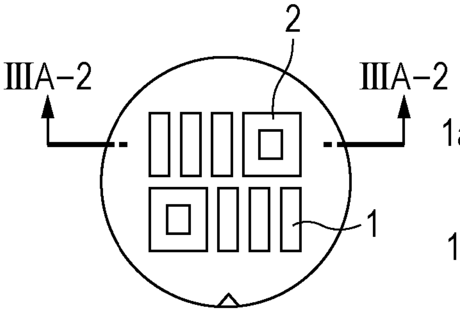
Figures 2, 3A:
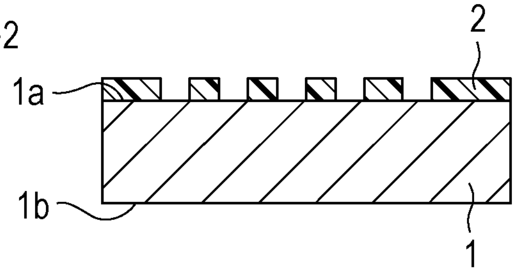
Figure 3B:
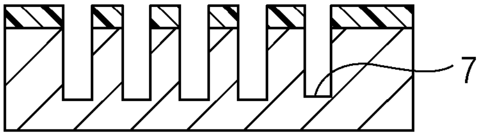
Figure 3C:
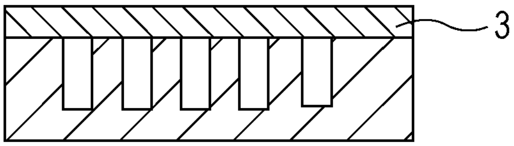
Figures 1, 3D:
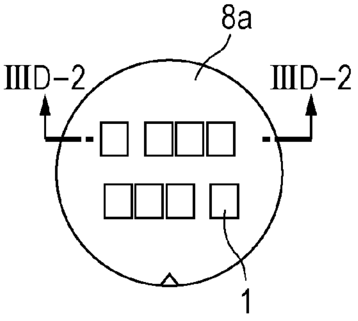
Figures 2, 3D:
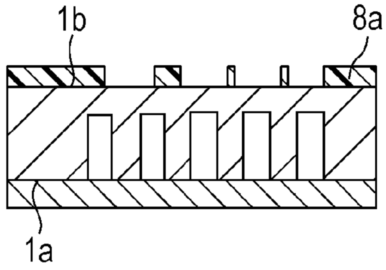
Figure 3E:
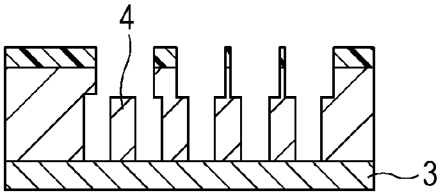
Figure 3F:
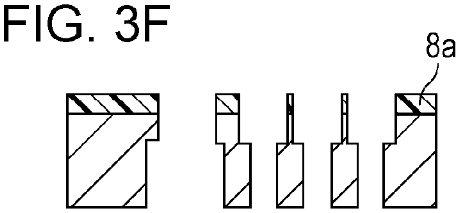
Figure 3G:
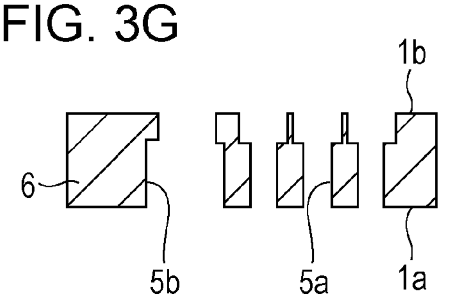

FIGS. 3A-1 to 3G are schematic views illustrating a method of making a semiconductor substrate according to a third embodiment of the present invention.

First, in the same way as in the second embodiment, grooves 7 and an etching stop layer 3, which is a protective tape, are formed in/on a mirror-finished surface 1*a* of a silicon substrate 1 (FIGS. 3A-1, 3A-2, 3B, and 3C). FIGS. 3A-1 and 3D-1 are plan views, and FIGS. 3A-2, 3B, 3C, 3D-2, 3E, 3F, and 3G are sectional views. In particular, FIG. 3A-2 is a sectional view taken along line IIIA-2-IIIA-2 in FIG. 3A-1.

Next, a positive resist is applied to the satin-finished surface 1*b* of the silicon substrate 1 by spin coating, and a second etching mask 8*a* is formed so as to have openings each having a width of 350 μm at positions to be connected to the grooves 7 after being etched (FIGS. 3D-1 and 3D-2). FIG. 3D-2 is a sectional view taken along line IIID-2-IIID-2 in FIG. 3D-1.

Next, through-holes are formed in the silicon substrate 1 by etching away portions of the silicon substrate 1 connected to the grooves 7 by performing reactive ion etching using a sulfur hexafluoride gas and a fluorocarbon gas from a surface on which the second etching mask 8*a* is formed. At this time, because the widths of the openings are the same, the through-holes in all areas of the surface are formed in about 20 minutes. As the through-holes are formed in the silicon substrate 1, inside the portions etched in frame-like shapes, isolated silicon islands 4, which are isolated from the silicon substrate 1 and supported by a protective tape, which is the etching stop layer 3, are formed. The thickness of each of the isolated silicon islands 4 is about 350 μm (FIG. 3E).

Next, from the silicon substrate 1, which has been etched, the protective tape, which is the etching stop layer 3, is thermally released from the silicon substrate 1. By removing the protective tape, the isolated silicon islands 4 are also removed (FIG. 3F). Next, the second etching mask 8*a* is removed. Thus, a semiconductor substrate 6 having the through-holes 5*a* and 5*b* is formed (FIG. 3G).

In the present embodiment, the etching times required to form the through-holes 5*a* and 5*b* are substantially the same (40 minutes from the mirror-finished surface 1*a* and 20 minutes from the satin-finished surface 1*b*). Therefore, over etching can be reduced, and hence notching can be suppressed and variation in the sizes of the through-holes can be reduced. Moreover, because it is not necessary to use a metal material as a protective layer, notching can be suppressed and variation in the sizes of the through-holes can be reduced through a simple process.

In the second embodiment, the second etching mask 8 is formed so that the silicon substrate is exposed in frame-like shapes along the inner edges of the through-holes 5*b*. In the present embodiment, the second etching mask 8*a* is formed so as to have the openings, each having a width of 350 μm, at positions to be connected to the grooves 7. Thus, without forming the second etching mask 8 so that the silicon substrate is exposed in frame-like shapes along the inner edges of the through-holes 5*b*, notching can be suppressed and variation in the sizes of the through-holes can be reduced. In the present embodiment, the heights of the isolated silicon islands 4 are low, so that the isolated silicon islands 4 can be more easily removed.

Next, a method of making a liquid ejection head substrate according to the present embodiment will be described.

First, a circuit substrate is prepared. Next, portions of a SiN protective layer corresponding to through-holes are removed in the same way as in the first embodiment. Next, through-holes are formed in the circuit substrate in the same way as described above with reference to FIGS. 3A-1 to 3G. The etching mask 2 is formed on a surface of the circuit substrate on which a circuit is not formed, and the second etching mask 8*a* is formed on the surface on which the circuit is formed.

Next, a liquid ejection head substrate is formed by forming a liquid channel and a liquid ejection port in the same way as in the first embodiment.

With the method of making a liquid ejection head substrate described above, the difference between the times required for etching large through-holes and small through-holes can be reduced. Therefore, over etching can be reduced. Accordingly, even when forming a plurality of through-holes in the circuit substrate, notching can be suppressed and variation in the sizes of the through-holes can be reduced. Moreover, because it is not necessary to use a metal material as a protective layer, notching can be suppressed and variation in the sizes of the through-holes can be reduced through a simple process.

Fourth Embodiment

Figures 1, 4A:
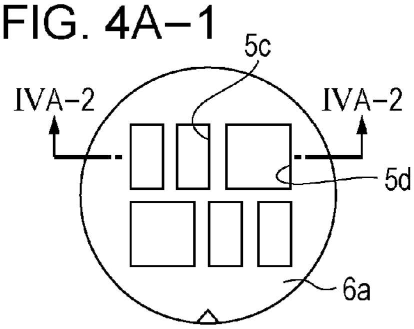
Figures 2, 4A:
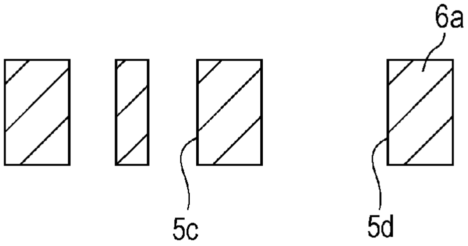
Figures 1, 4B:
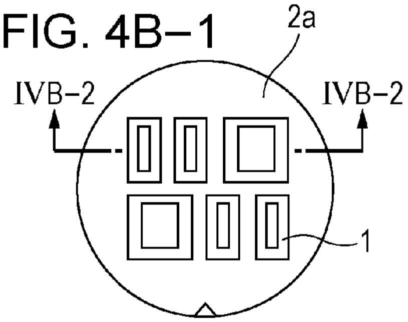
Figures 2, 4B:
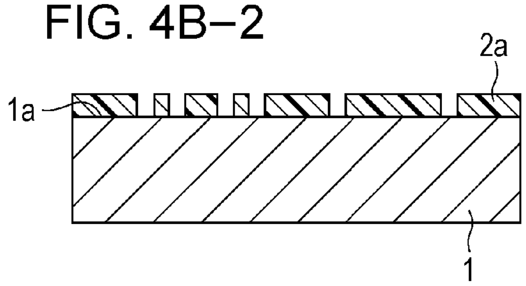
Figure 4C:
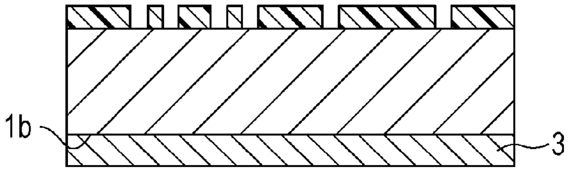
Figures 1, 4D:
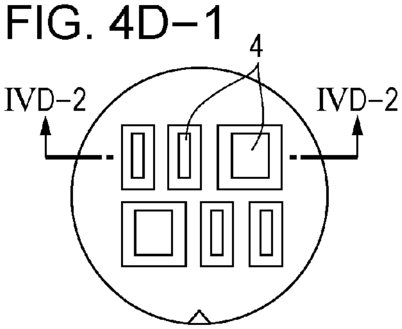
Figures 2, 4D:
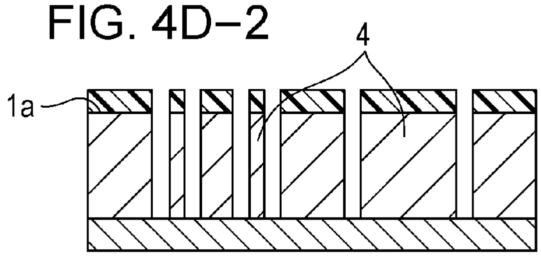
Figure 4E:
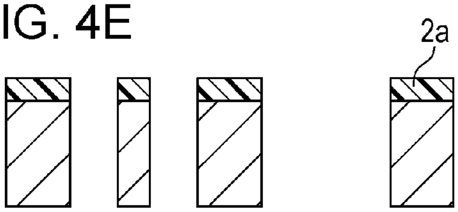

FIGS. 4A-1 to 4E are schematic views illustrating a method of making a semiconductor substrate according to a fourth embodiment of the present invention. In the following example, a method of making a semiconductor substrate 6*a* (FIGS. 4A-1 and 4A-2) that has a plurality of through-holes 5*c*, each having a size of 300 μm×600 μm, and a plurality of through-holes 5*d*, each having a size of 600 μm×600 μm, will be described. FIGS. 4A-1, 4B-1, and 4D-1 are plan views, and FIGS. 4A-2, 4B-2, 4D-2, and 4E are sectional views. In particular, FIG. 4A-2 is a sectional view taken along line IVA-2-IVA-2 in FIG. 4A-1.

First, a positive resist is applied to a mirror-finished surface 1*a* of a silicon substrate 1 by spin coating in the same way as in the first embodiment. Next, i-line exposure is performed through a photomask. Regions corresponding to the through-holes 5*c* and 5*d* are exposed to light so that the silicon substrate 1 is exposed in frame-like shapes along the inner edges of the through-holes 5*a* and 5*b*. The line width of the frame is 100 μm.

In the case of the through-holes 5*c* and 5*d* according to the present embodiment, in contrast to the first embodiment, it is not possible to expose the silicon substrate 1 in frame-like shapes along the inner edges of the larger through-holes with a line width the same as the length of the short side of the smaller through-holes. Therefore, in the present embodiment, in order to make the etching rates for regions corresponding to the through-holes 5*c* and the through-holes 5*d* be substantially the same as each other, a pattern is formed so that the silicon substrate is exposed in frame-like shapes with an equal line width along the inner edges of all of the through-holes.

Next, an etching mask 2*a* is formed by performing development using an alkali developer including tetramethylammonium hydroxide (TMAH) (FIGS. 4B-1 and 4B-2). To be specific, the etching mask 2*a* is formed so that portions of the silicon substrate respectively corresponding to the through-holes 5*c* and 5*d* are exposed in frame-like shapes with an equal line width along the inner edges of the through-holes 5*c* and 5*d*.

Next, in the same way as in the first embodiment, the etching stop layer 3 is formed (FIG. 4C), and through-holes are formed in the silicon substrate 1 by reactive ion etching (FIGS. 4D-1 and 4D-2). At this time, because the line widths of portions of the silicon substrate 1 that are exposed are the same, the portions of the silicon substrate 1 corresponding to the through-holes in all areas are etched away in about 120 minutes. Isolated silicon islands 4 are formed inside the portions that are etched in frame-like shapes. FIG. 4D-2 is a sectional view taken along line IVD-2-IVD-2 in FIG. 4D-1.

Next, from the silicon substrate 1, which has been etched, the protective tape, which is the etching stop layer 3, is thermally released from the silicon substrate 1. By removing the protective tape, the isolated silicon islands 4 are also removed (FIG. 4E). Next, the etching mask 2*a* is removed. Thus, a semiconductor substrate 6*a* having the through-holes 5*c* and 5*d* is formed (FIGS. 4A-1 and 4A-2).

In the present embodiment, the etching mask 2*a* is formed so that the silicon substrate is exposed in frame-like shapes along the inner edges of all of the through-holes with an equal line width. Therefore, the times required for etching away the frame-shaped exposed portions corresponding to all of the through-holes are substantially the same. The isolated silicon islands 4 are formed by etching away the frame-shaped exposed portions of the silicon substrate, and the through-holes 5*c* and 5*d* are formed by removing the isolated silicon islands 4. Accordingly, the times required for forming the through-holes 5*c* and 5*d* are substantially the same.

Therefore, over etching can be reduced, and hence notching can be suppressed and variation in the sizes of the through-holes can be reduced. Moreover, because it is not necessary to use a metal material as a protective layer, notching can be suppressed and variation in the sizes of the through-holes can be reduced through a simple process.

Next, a method of making a liquid ejection head substrate according to the present embodiment will be described.

First, a circuit substrate is prepared. Next, portions of a SiN protective layer corresponding to through-holes are removed in the same way as in the first embodiment. Next, through-holes are formed in the circuit substrate in the same way as described above with reference to FIGS. 4A-1 to 4E. Next, a liquid ejection head substrate is formed by forming a liquid channel and a liquid ejection port in the same way as in the first embodiment.

With the method of making a liquid ejection head substrate described above, the difference between the times required for etching large through-holes and small through-holes can be reduced. Therefore, over etching can be reduced. Accordingly, even when forming a plurality of through-holes in the circuit substrate, notching can be suppressed and variation in the sizes of the through-holes can be reduced. Moreover, because it is not necessary to use a metal material as a protective layer, notching can be suppressed and variation in the sizes of the through-holes can be reduced through a simple process.

Fifth Embodiment

Figures 1, 5A:
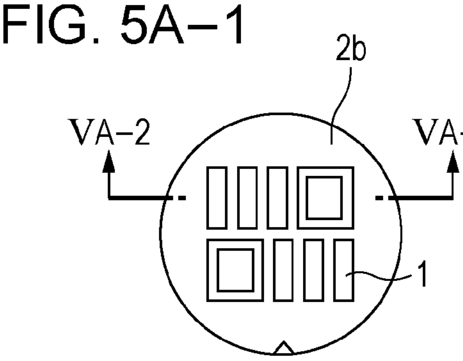
Figures 2, 5A:
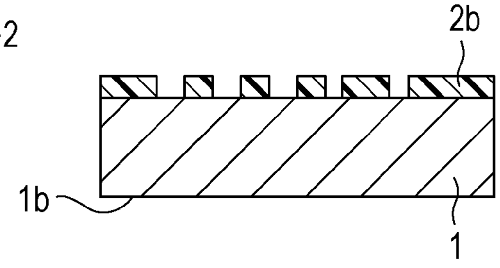
Figure 5B:
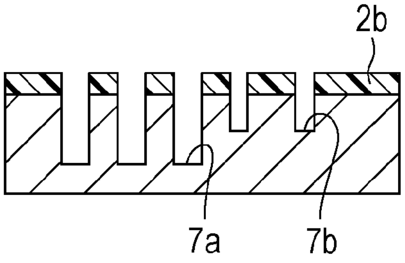
Figure 5C:
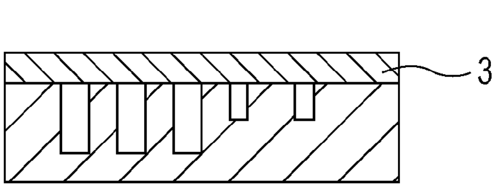
Figures 1, 5D:
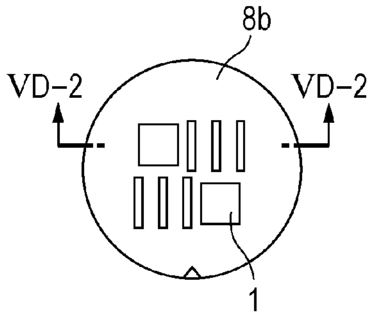
Figures 2, 5D:
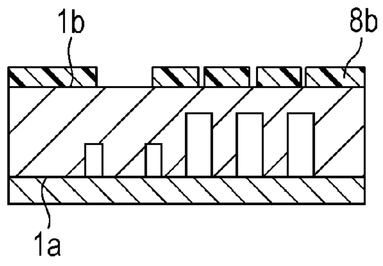
Figure 5E:
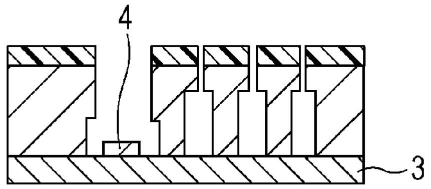
Figure 5F:
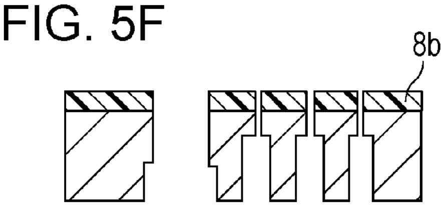
Figure 5G:
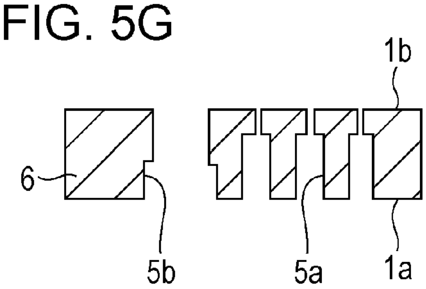

FIGS. 5A-1 to 5G are schematic views illustrating a method of making a semiconductor substrate according to a fifth embodiment of the present invention. In the following example, a method of making a semiconductor substrate 6 that has a plurality of through-holes 5*a*, each having a size of 200 μm×600 μm, and a plurality of through-holes 5*b*, each having a size of 600 μm×600 μm, will be described. FIGS. 5A-1 and 5D-1 are plan views, and FIGS. 5A-2, 5B, 5C, 5D-2, 5E, 5F, and 5G are sectional views.

First, a silicon substrate 1 is prepared. The thickness of the silicon substrate 1 is, for example, 725 μm. Next, an adhesion enhancing layer (not shown) is made by applying HMDS to a mirror-finished surface 1*a* of the silicon substrate 1. Subsequently, a positive resist is applied by spin coating so as to have a thickness of 10 μm. Next, i-line exposure is performed through a photomask. At this time, regions corresponding to the through-holes 5*a* are exposed to light with the same sizes as the through-holes 5*a*. Regions corresponding to the through-holes 5*b* are exposed to light so that the silicon substrate is exposed in frame-like shapes along the inner edges of the through-holes 5*b*. Here, the line width of the frames is 100 μm. Next, development is performed by using an alkali developer including TMAH.

Through the process described above, an etching mask 2*b* is formed on the mirror-finished surface 1*a* of the silicon substrate 1. To be specific, the etching mask 2*b* is formed so that portions of the silicon substrate corresponding to the through-holes 5*a* are exposed in frame-like shapes along the inner edges of the through-holes 5*b* with a width of 100 μm (FIGS. 5A-1 and 5A-2). FIG. 5A-2 is a sectional view taken along line VA-2-VA-2 in FIG. 5A-1.

After the step of forming the etching mask 2*b*, grooves 7*a* and 7*b* are formed in the silicon substrate 1 by performing reactive ion etching for 40 minutes by using a sulfur hexafluoride gas and a fluorocarbon gas from a surface on which the etching mask 2*b* is formed (FIG. 5B). The grooves 7*a*, which are formed so as to correspond to the through-holes 5*a*, have an average depth of 450 μm. The groove 7*b*, which are formed so as to correspond to the through-holes 5*b*, have an average depth of 225 μm.

Next, after removing the etching mask 2*b*, an adhesive protective tape is applied to the mirror-finished surface 1*a*, in which the grooves 7*a* and 7*b* have been formed, to form the etching stop layer 3 (FIG. 5C).

Next, a second etching mask 8*b* is formed on the satin-finished surface 1*b* of the silicon substrate 1. The second etching mask 8*b* has openings, each having a width of 50 μm, at positions to be connected to the grooves 7*a* after being etched and has openings, each having a width of 500 μm, at positions to be connected to the grooves 7*b* after being etched (FIGS. 5D-1 and 5D-2). FIG. 5D-2 is a sectional view taken along line VD-2-VD-2 in FIG. 5D-1.

Next, through-holes are formed in the silicon substrate 1 by etching away portions of the silicon substrate 1 connected to the grooves 7*a* and 7*b* by performing reactive ion etching using a sulfur hexafluoride gas and a fluorocarbon gas from a surface on which the second etching mask 8*b* is formed. The time required for etching away portions connected to the grooves 7*a* through the openings each having a width of 50 μm and the time required for etching away portions connected to the grooves 7*b* through the openings each having a width of 500 μm are both about 30 minutes. As the through-holes are formed in the silicon substrate 1, inside the portions etched in frame-like shapes, isolated silicon islands 4, which are isolated from the silicon substrate 1 and supported by a protective tape, which is the etching stop layer 3, are formed (FIG. 5E). The thickness of each of the isolated silicon islands 4 is about 150 μm.

Next, the protective tape, which is the etching stop layer 3, is thermally released from the silicon substrate 1. By removing the protective tape, the isolated silicon islands 4 are also removed (FIG. 5F). Next, the second etching mask 8*b* is removed. Thus, a semiconductor substrate 6 having the through-holes 5*a* and 5*b* is formed (FIG. 5G).

In the present embodiment, the etching times required for forming the through-holes 5*a* and 5*b* are substantially the same (40 minutes from the mirror-finished surface 1*a* and 30 minutes from the satin-finished surface 1*b*). Therefore, over etching can be reduced, and hence notching can be suppressed and variation in the sizes of the through-holes can be reduced. Moreover, because it is not necessary to use a metal material as a protective layer, notching can be suppressed and variation in the sizes of the through-holes can be reduced through a simple process.

In the present embodiment, the heights of the isolated silicon islands 4 are lower than those in the third embodiment, so that the isolated silicon islands 4 can be more easily removed.

In both of the third and fifth embodiments, the through-holes are formed in the silicon substrate 1 by performing reactive ion etching from both of the mirror-finished surface 1*a* and the satin-finished surface 1*b*. In this case, it is not necessary to form a resist mask so that the ratios of the etching rates in these surfaces are in the range of 0.8 to 1.2. It is only necessary that the sum of the time for which reactive ion etching is performed from the mirror-finished surface 1*a* and the time for which reactive ion etching is performed from the satin-finished surface 1*b* be substantially the same for all the through-holes.

Next, a method of making a liquid ejection head substrate according to the present embodiment will be described.

First, a circuit substrate is prepared. Next, portions of a SiN protective layer corresponding to through-holes are removed in the same way as in the first embodiment. Next, through-holes are formed in the circuit substrate in the same way as described above with reference to FIGS. 5A-1 to 5G. The etching mask 2 is formed on a surface of the circuit substrate on which a circuit is not formed, and the second etching mask 8*b* is formed on the surface on which the circuit is formed.

Next, a liquid ejection head substrate is formed by forming a liquid channel and a liquid ejection port in the same way as in the first embodiment.

With the method of making a liquid ejection head substrate described above, the difference between the times required for etching large through-holes and small through-holes can be reduced. Therefore, over etching can be reduced. Accordingly, even when forming a plurality of through-holes in the circuit substrate, notching can be suppressed and variation in the sizes of the through-holes can be reduced. Moreover, because it is not necessary to use a metal material as a protective layer, notching can be suppressed and variation in the sizes of the through-holes can be reduced through a simple process.

In each of the first to fifth embodiments described above, through-holes are formed in a single silicon substrate. However, the present invention can be applied to a substrate bonding method, in which a substrate including two silicon substrates that are bonded to each other is used. The substrate bonding method is widely used to form a silicon on insulator (SOI) substrate by, for example, bonding two silicon substrates with an oxide layer therebetween. Besides the bonding method, a separation by implantation of oxygen (SIMOX) method is a known method for forming an SOI substrate. The present invention can be applied to a substrate in which an oxide layer is formed by using the SIMOX method or the like. Here, it is assumed that SOI substrates made by using the SIMOX method fall in the category of substrates made by using the substrate bonding method. When the present invention is applied to a substrate including a first substrate and a second substrate that are bonded by using the substrate bonding method, a hole can be formed so as to extend through the first substrate without affecting the second substrate. When an oxide layer is disposed between the first substrate and the second substrate, such a hole extends at least to the oxide layer. In the following description, processing the first substrate in this way will be referred to as "forming a hole" or "processing in the shape of a hole". Alternatively, a frame-shaped groove having a depth reaching a bottom surface of the first substrate may be formed in the first substrate, and the first substrate may be processed so that an isolated silicon island remains in the frame-shaped groove. Processing the first substrate in this way will be referred to as "forming a protrusion" or "processing in the shape of a protrusion". In this case, the isolated silicon island is isolated from the first substrate in the in-plane direction of the substrate but is connected to the oxide layer. In a case of forming an unbonded area as described below, the isolated silicon island is isolated also from the oxide layer at a position at which the unbonded area is formed. According to the present invention, as is clear from the following description, even when forming a plurality of holes having different sizes in the SOI substrate, notching can be suppressed and variation in the sizes of the holes can be reduced through a simple process.

In the case of using the substrate bonding method, an unbonded area may be formed, so as to correspond to the position of a hole or a protrusion, in an oxide layer in the bonded substrates or in a silicon portion in contact with the oxide layer, that is, at the interface between the oxide layer and the semiconductor substrate. The oxide layer in the substrate serves to bond two silicon substrates that are superposed on each other. A method of forming an unbonded area is not particularly limited. For example, in accordance with the position at which a hole or a protrusion is to be formed, as in each of sixth, eighth, and tenth embodiments, which are respectively illustrated in FIGS. 6A to 6F-2, FIGS. 8A to 8D-2, and FIGS. 10A to 10D-2, an unbonded areas may be formed by performing masking or the like during plasma processing before bonding the substrates to each other. In this case, the oxide layer is not directly processed. Alternatively, as in each of seventh and ninth embodiments, which are respectively illustrated in FIGS. 7A to 7E-2 and FIGS. 9A to 9E-2, an unbonded area may be formed by performing half etching or full etching on the oxide layer. In the case of performing full etching on the oxide layer, as illustrated in FIGS. 9A to 9E-2, a pattern is formed inside or outside a frame-shaped pattern, in accordance with which the substrate is subsequently to be processed by reactive ion etching, so that the oxide layer remains unetched under the frame shaped pattern. In the case where the SIMOX method is used to form an oxide layer in the substrate, as illustrated in FIGS. 10A to 10D-2, the oxide layer is formed along the outline of a hole or a protrusion. By forming the oxide layer in the substrate in this way, the oxide layer serves as an etching stop layer when reactive ion etching is performed.

Figure 11A:
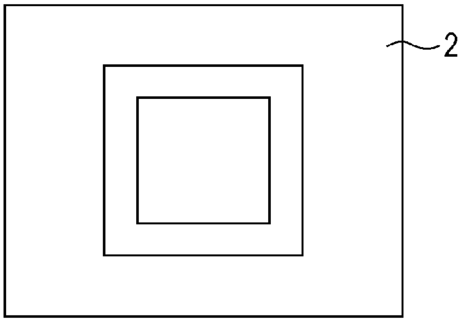
FIGS. 11A to 11H illustrate examples of various patterns on an etching mask.
Figure 11B:
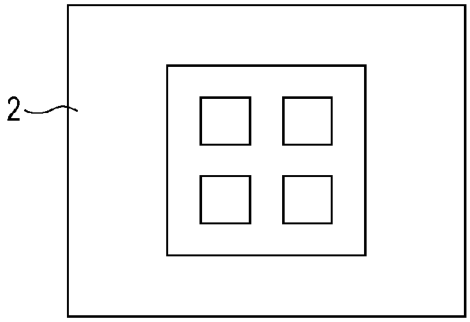
Figure 11C:
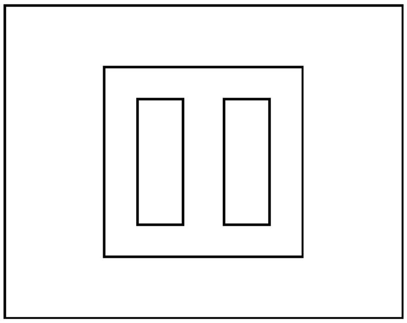
Figure 11D:
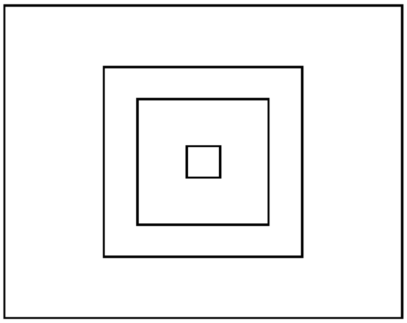
Figure 11E:
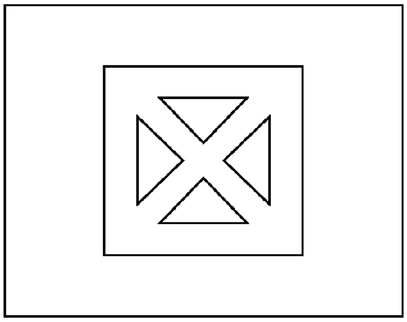
Figure 11F:
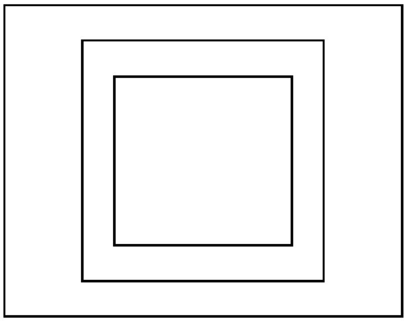
Figure 11G:
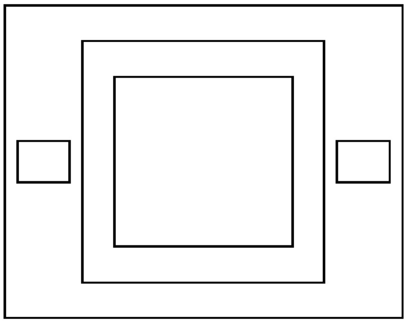
Figure 11H:
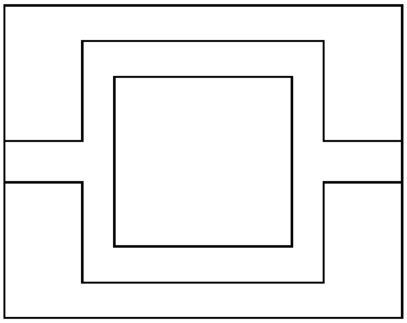

Also in the case where the present invention is applied to the substrate bonding method, any of a positive resist and a negative resist can be used as a resist for forming an etching mask. The etching mask has an appropriate thickness with which the etching mask is not eliminated while reactive ion etching is performed. The thickness is, for example, 15 μm. Patterning of the resist is performed by exposing the resist to light having a wavelength to which the resist is photosensitive through a mask or a reticle having a desired pattern by using a projection exposure device, a reduction exposure device, or the like. After the pattern has been transferred to the resist, development is performed. The pattern is formed in a frame-like shape along the outline of a hole or a protrusion. The pattern may have any of various appropriate shapes, such as those illustrated in FIGS. 11A to 11H. In FIGS. 11A to 11H, the densely hatched portions each correspond to an etching mask 2. For example, FIG. 11A illustrates an etching mask 2 that has a simple shape and that is used to form a hole, and FIG. 11F illustrates an etching mask 2 that has a simple shape and that is used to form a protrusion. Alternatively, a pattern may be formed in a portion of the frame from which an isolated silicon island is to be removed. Further alternatively, a pattern may be formed for all of holes or protrusions of the substrate surface or for some of the holes or protrusions of the substrate surface. The patterns illustrated in FIGS. 11A to 11H may also be used in the first to fifth embodiments.

Also in the case where the present invention is applied to the substrate bonding method, reactive ion etching is performed by using a gas and a method that are appropriate for etching a silicon substrate. Typically, etching is performed by deep-RIE using a sulfur hexafluoride gas and a fluorocarbon gas. End point detection can be performed by monitoring emission of light during etching. The isolated silicon island 4 formed by reactive ion etching can be removed after etching has been finished. However, the isolated silicon island 4 may be removed simultaneously with removing the resist used as the etching mask 2. In a case where the silicon substrate 1 and the oxide layer 13 are connected to each other, the isolated silicon island 4 can be removed simultaneously with etching the oxide layer 13 by using buffered hydrogen fluoride (BHF) or the like. As a result, by applying the present invention to the substrate bonding method, the shapes illustrated in FIGS. 12A-1 to 12B-2 can be formed. FIGS. 12A-1 is a sectional view and FIG. 12A-2 is a plan view illustrating an example in which a hole is formed. Here, a hole 18 is formed in a silicon substrate 19 by reactive ion etching. The silicon substrate 19 includes a silicon substrate 1, in which the hole 18 has been formed, and a silicon substrate 12, which is bonded to the silicon substrate 1 with an oxide layer 13 therebetween. The silicon substrate 12, which is illustrated in a lower part of FIG. 12A-1, is not affected by reactive ion etching. FIGS. 12B-1 is a sectional view and FIG. 12B-2 is a plan view illustrating an example in which a protrusion is formed. The protrusion is formed on the silicon substrate 12 with the oxide layer 13 therebetween by performing reactive ion etching so that an isolated silicon island 4 remains and portions of the silicon substrate surrounding the isolated silicon island 4 are removed.

Sixth Embodiment

Referring to FIGS. 6A to 6F-2, a method of making an SOI substrate that has a plurality of holes, each having a size of 500 μm×500 μm, will be described. FIGS. 6A, 6B, 6C, 6D-1, 6E-1, and 6F-1 are sectional views, and FIGS. 6D-2, 6E-2, and 6F-2 are plan views. In particular, FIGS. 6D-1, 6E-1, and 6F-1 are respectively sectional views taken along lines VID-1-VID-1, VIE-1-VIE-1, and VIF-1-VIF-1 in FIGS. 6D-2, 6E-2, and 6F-2.

Figure 6A:
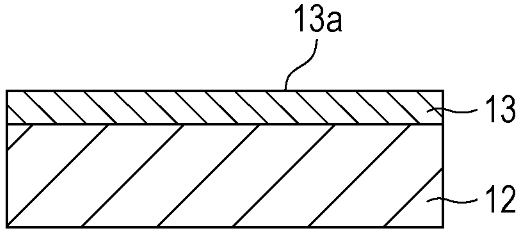
Figure 6B:
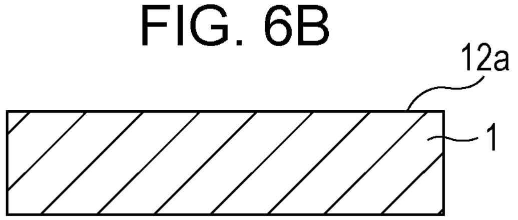
Figure 6C:
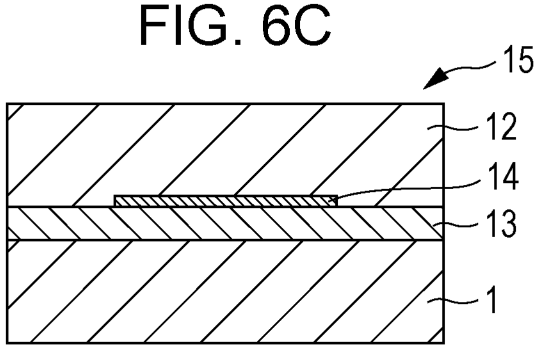

A silicon substrate 12 (FIG. 6A), which is a supporting substrate and on which an oxide layer 13 has been formed, and a silicon substrate 1 (FIG. 6B), in which holes are to be formed, are prepared. When bonding a silicon substrate 1 to a silicon substrate 12, a bonding surface 13*a* near the oxide layer 13 and a bonding surface 12*a* near the silicon substrate 1 are irradiated with plasma. At this time, a region inside the outline of a hole to be formed is masked and irradiated with plasma, and subsequently, the silicon substrates 1 and 12 are bonded. By doing so, a silicon substrate 15 including an oxide layer 13 and an unbonded area 14 disposed therein is formed (FIG. 6C). The unbonded area 14, which is planar, may be called an unbonded surface. The silicon substrate 15 is an SOI substrate. Next, a positive resist is applied to a surface 15*a* of the silicon substrate 15 by spin coating. Next, i-line exposure is performed through a photomask in a frame-like shape along the outline of the hole. Next, an etching mask 2 is formed (FIGS. 6D-1 and 6D-2) by performing development using an alkali developer including TMAH.

Next, from a surface on which the etching mask 2 is formed, reactive ion etching is performed by using a sulfur hexafluoride gas and a fluorocarbon gas, so that a frame-shaped hole having a depth reaching the oxide layer 13, which is an etching stop layer in the silicon substrate 15, is formed. Due to the etching, an isolated silicon island 4 is formed in the silicon substrate 15 (FIGS. 6E-1 and 6E-2). Lastly, the isolated silicon island 4 is removed simultaneously with removing the etching mask 6, so that a silicon substrate 19 having a hole 18 is made (FIGS. 6F-1 and 6F-2).

The method according to the present embodiment is effective in a case where it is necessary that the oxide layer 13 remain uniformly in the substrate and in a case where it is desirable to reduce the number of steps to the minimum. With the method of making the silicon substrate 19, the silicon etching amount during reactive ion etching is reduced, and therefore the amount of heat generated during etching can be reduced and the resist can be removed without difficulty.

Seventh Embodiment

Figure 7A:
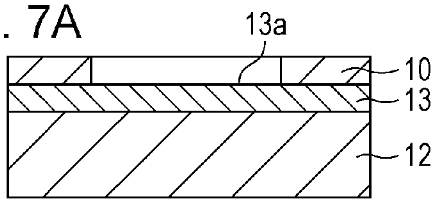
Figure 7B:
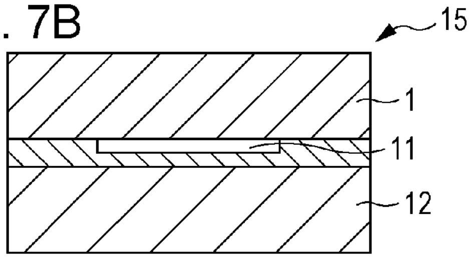
Figure 7C:
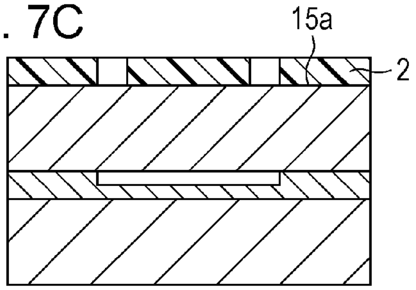
Figures 1, 7D:
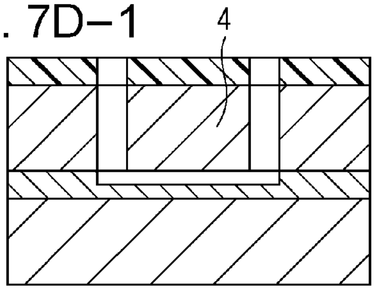
Figures 2, 7D:
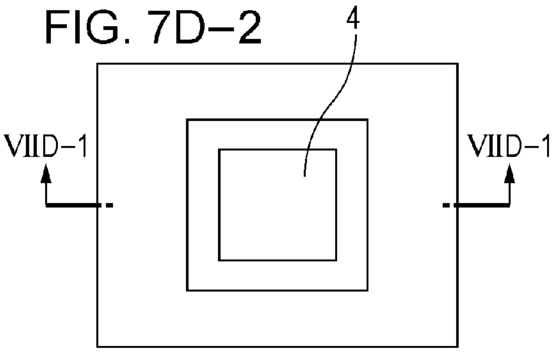
Figures 1, 7E:
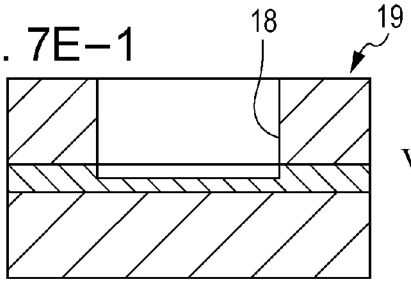
Figures 2, 7E:
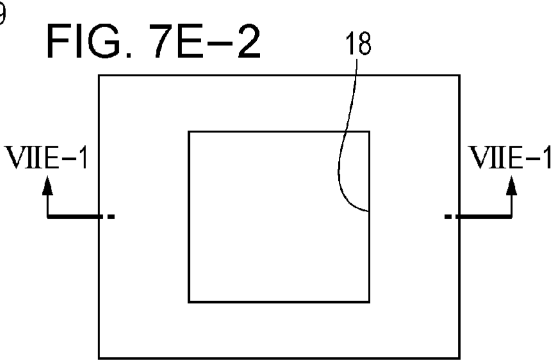

FIGS. 7A to 7E-2 are schematic views illustrating a method of making a semiconductor substrate according to a seventh embodiment of the present invention. FIGS. 7A, 7B, 7C, 7D-1, and 7E-1 are sectional views, and FIGS. 7D-2 and 7E-2 are plan views. In particular, FIGS. 7D-1 and 7E-1 are respectively sectional views taken along lines VIID-1-VIID-1 and VIIE-1-VIIE-1 in FIGS. 7D-2 and 7E-2.

First, a silicon substrate the same as that of the sixth embodiment is prepared. Before bonding a silicon substrate 1 and a silicon substrate 12, a resist is applied to a surface 13*a* of an oxide layer 13 of a silicon substrate 12 by spin coating. Next, i-line exposure is performed through a photomask on a region inside the outline of a hole. Next, an oxide layer etching mask 10 is formed by performing development using an alkali developer including TMAH (FIG. 7A). Next, the oxide layer 13 is half-etched so that a half of the thickness thereof is reduced by performing etching using BHF. By bonding the silicon substrates 1 and 12, a silicon substrate 15 having the oxide layer 13 and an unbonded area 11, which is an air gap, disposed therein is formed (FIG. 7B). Next, in the same way as in the sixth embodiment, an etching mask 2 is formed on a surface 15*a* of the silicon substrate 15 (FIG. 7C). A frame-shaped hole is formed in the surface 15*a* of the silicon substrate 15 by reactive ion etching (FIGS. 7D-1 and 7D-2). Lastly, an isolated silicon island 4 is removed simultaneously with removing the etching mask 2, so that a silicon substrate 19 having a hole 18 is made (FIGS. 7E-1 and 7E-2).

The method according to the present embodiment is effective in a case where it is necessary to perform plasma processing on entire surfaces when bonding the silicon substrates and in a case where it is desirable to reduce the number of steps. With the method of making the silicon substrate 19, the silicon etching amount during reactive ion etching is reduced, and therefore the amount of heat generated during etching can be reduced and the resist can be removed without difficulty.

Eighth Embodiment

FIGS. 8A to 8D-2 are schematic views illustrating a method of making a semiconductor substrate according to an eighth embodiment of the present invention. FIGS. 8A, 8B-1, 8C-1, and 8D-1 are sectional views, and FIGS. 8B-2, 8C-2, and 8D-2 are plan views. In particular, FIGS. 8B-1, 8C-1, and 8D-1 are respectively sectional views taken along lines VIIIB-1-VIIIB-1, VIIIC-1-VIIIC-1, and VIIID-1-VIIID-1 in FIGS. 8B-2, 8C-2, and 8D-2.

Figure 8A:
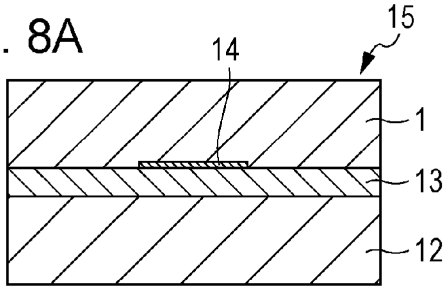
Figures 1, 8B:
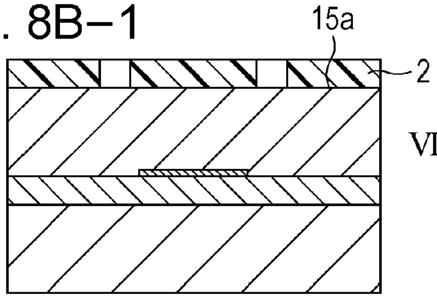
Figures 2, 8B:
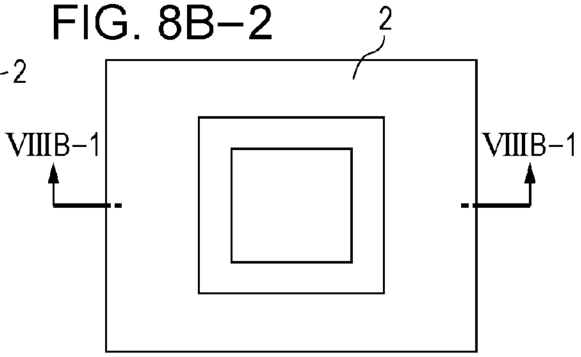
Figures 1, 8C:
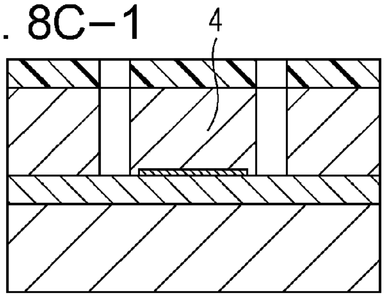
Figures 2, 8C:
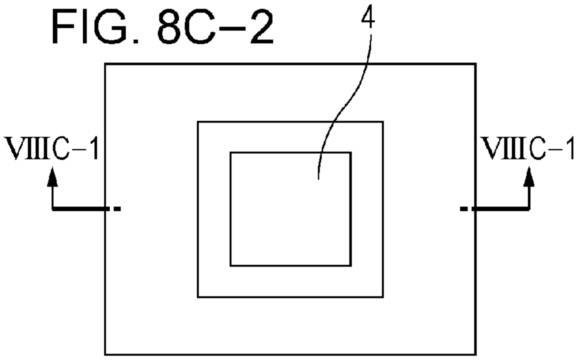
Figures 1, 8D:
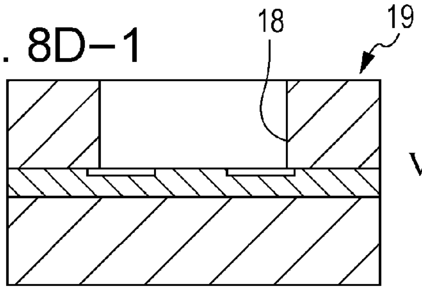
Figures 2, 8D:
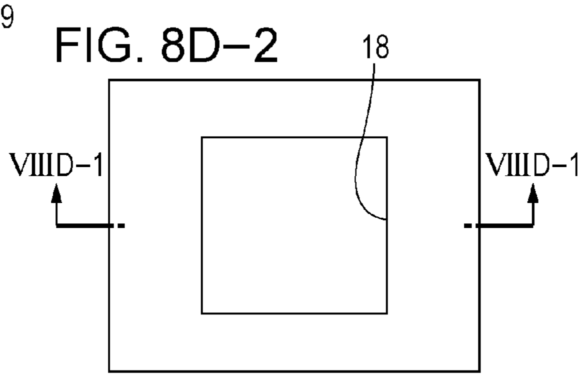

First, a silicon substrate the same as that of the sixth embodiment is prepared. When bonding a silicon substrate 1 to a silicon substrate 12, a bonding surface 13*a* and a bonding surface 12*a* (see FIGS. 6A and 6B) are irradiated with plasma. At this time, a region inside a frame to be subsequently formed is masked and irradiated with plasma, and the silicon substrates 1 and 12 are bonded. By doing so, a silicon substrate 15 including an oxide layer 13 and an unbonded area 14 disposed therein is formed (FIG. 8A). Next, in the same way as in the sixth embodiment, an etching mask 2 is formed on a surface 15*a* of the silicon substrate 15 (FIGS. 8C-1 and 8C-2). A frame-shaped hole is formed in the surface 15*a* of the silicon substrate 15 by reactive ion etching. At this time, the frame-shaped hole is formed outside of the unbonded area 14, so that an isolated silicon island 4, which is supported by the oxide layer 13 in the silicon substrate 15, is formed (FIGS. 8C-1 and 8C-2). Next, the oxide layer 13 and the isolated silicon island 4 are removed by performing etching using BHF. Thus, a part of the silicon substrate 15 and the isolated silicon island 4 are removed and a silicon substrate 19 having a hole 18 is made (FIGS. 8D-1 and 8D-2).

The method according to the present embodiment is effective in a case where it is necessary to support the isolated silicon island 4 on the silicon substrate 15 when reactive ion etching is finished and it is necessary that the oxide layer 13 remain uniformly in the substrate and in a case where it is desirable to reduce the number of steps to the minimum. With the method of making the silicon substrate 19, the silicon etching amount during reactive ion etching is reduced, and therefore the amount of heat generated during etching can be reduced and the resist can be removed without difficulty.

Ninth Embodiment

Figure 9A:
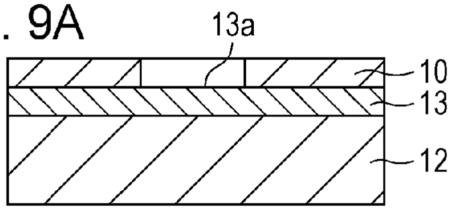
Figure 9B:
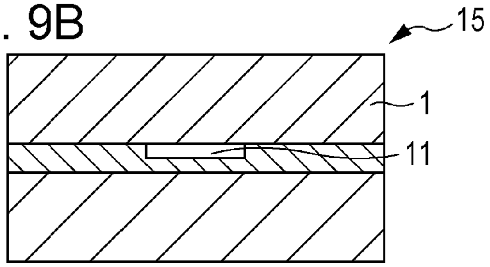
Figure 9C:
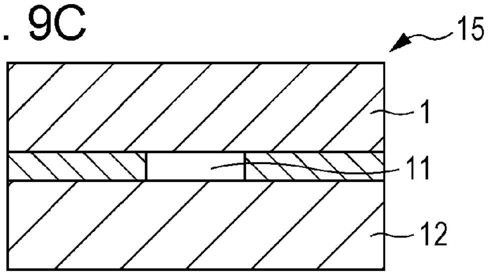
Figures 1, 9D:
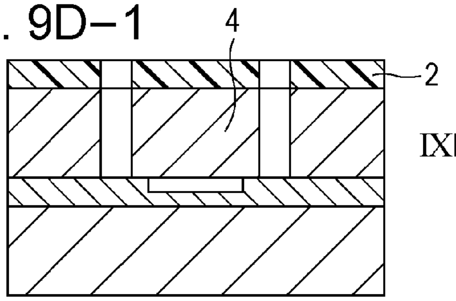
Figures 2, 9D:
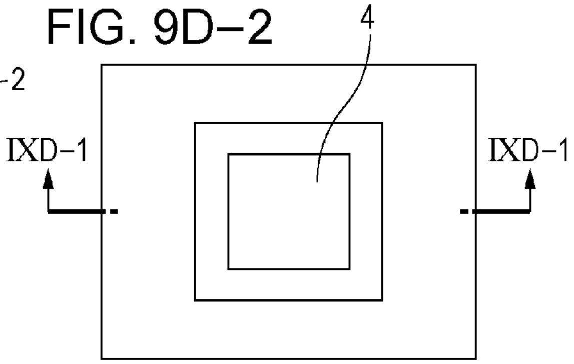
Figures 1, 9E:
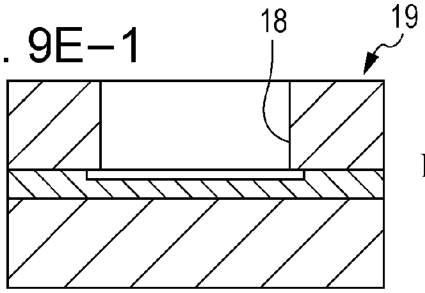
Figures 2, 9E:
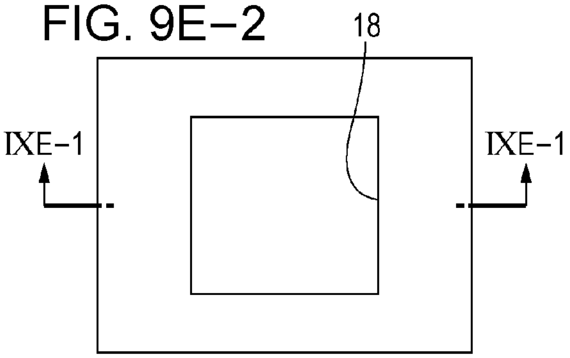

FIGS. 9A to 9E-2 are schematic views illustrating a method of making a semiconductor substrate according to a ninth embodiment of the present invention. FIGS. 9A, 9B, 9C, 9D-1, and 9E-1 are sectional views, and FIGS. 9D-2 and 9E-2 are plan views. In particular, FIGS. 9D-1 and 9E-1 are respectively sectional views taken along lines IXD-1-IXD-1 and IXE-1-IXE-1 in FIGS. 9D-2 and 9E-2.

First, a silicon substrate the same as that of the sixth embodiment is prepared. Before bonding a silicon substrate 1 and a silicon substrate 12, a resist is applied to a surface 13*a* of an oxide layer 13 of a silicon substrate 12 by spin coating. Next, i-line exposure is performed through a photomask on a region inside a frame to be subsequently formed. Next, an oxide layer etching mask 10 is formed by performing development using an alkali developer including TMAH (FIG. 9A). Next, the oxide layer 13 is half-etched so that a half of the thickness thereof is reduced or is fully-etched by performing etching using BHF. Subsequently, by bonding the silicon substrates 1 and 12, a silicon substrate 15 having the oxide layer 13 and an unbonded area 11, which is an air gap, disposed therein is formed. FIG. 9B illustrates a silicon substrate 15 that has been half-etched in this step, and FIG. 9C illustrates a silicon substrate 15 that has been fully etched in this step.

Next, in the same way as in the sixth embodiment, by performing reactive ion etching using an etching mask 2, a frame-shaped hole is formed in the silicon substrate 15 (FIGS. 9D-1 and 9D-2). Due to the etching, an isolated silicon island 4 is formed in the silicon substrate 15. Next, the oxide layer 13 in the substrate is removed by performing etching using BHF. Thus, a part of the silicon substrate 15 and the isolated silicon island 4 are removed and a silicon substrate 19 having a hole 18 is made (FIGS. 9E-1 and 9E-2).

The method according to the present embodiment is effective in a case where it is necessary to support the isolated silicon island 4 on the silicon substrate 15 when reactive ion etching is finished and it is necessary to perform plasma processing on entire surfaces when bonding the silicon substrates. With the method of making the silicon substrate 19, the silicon etching amount during reactive ion etching is reduced, and therefore the amount of heat generated during etching can be reduced and the resist can be removed without difficulty.

Tenth Embodiment

FIGS. 10A to 10D-2 are schematic views illustrating a method of making a semiconductor substrate according to a tenth embodiment of the present invention. FIGS. 10A, 10B-1, 10C-1, and 10D-1 are sectional views, and FIGS. 10B-2, 10C-2, and 10D-2 are plan views. In particular, FIGS. 10B-1, 10C-1, and 10D-1 are respectively sectional views taken along lines XB-1-XB-1, XC-1-XC-1, and XD-1-XD-1 of FIGS. 10B-2, 10C-2, and 10D-2.

Figure 10A:
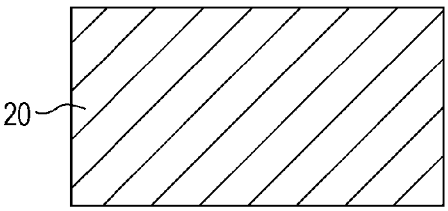
Figures 1, 10B:
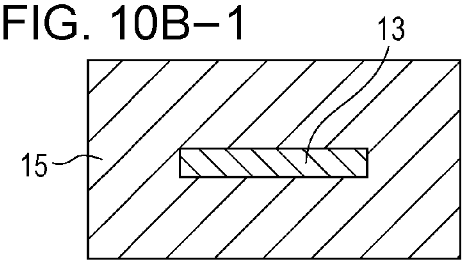
Figures 2, 10B:
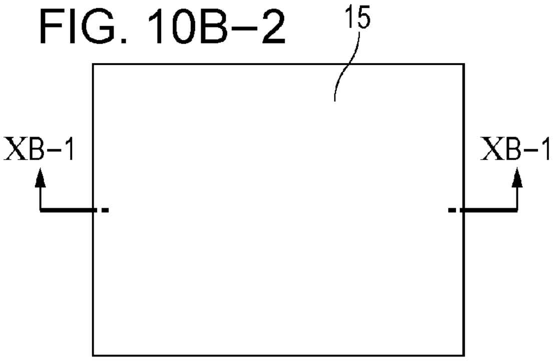

First, a silicon substrate 20 is prepared (FIG. 10A). A silicon substrate 15 including an oxide layer 13 disposed therein is formed by implanting oxygen ions into the silicon substrate 20 by using the SIMOX method. At this time, the depth to which oxygen ions are implanted to form the oxide layer 13 is the same as the depth of a hole to be formed, and a pattern of ion implantation is the same as the shape of a hole to be formed (FIGS. 10B-1 and 10B-2).

Figures 1, 10C:
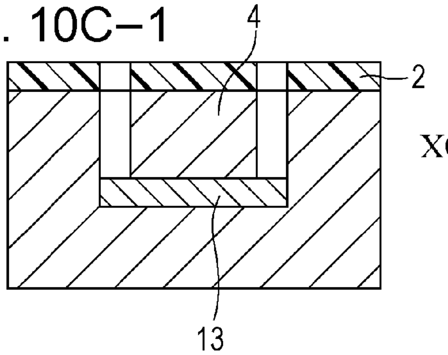
Figures 2, 10C:
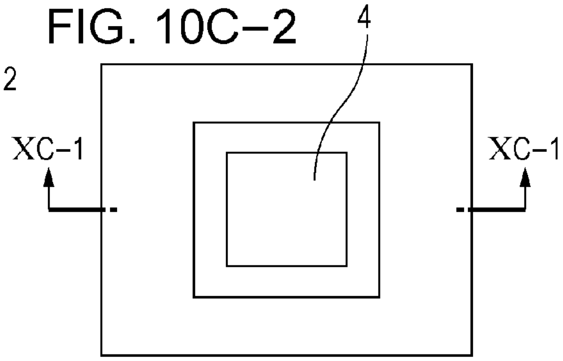
Figures 1, 10D:
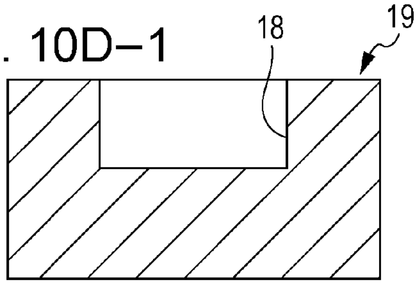
Figures 2, 10D:
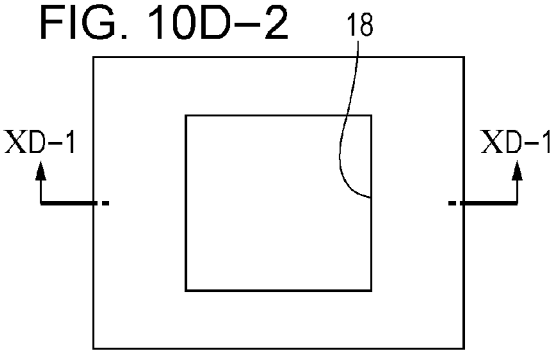

Next, in the same way as in the sixth embodiment, by performing reactive ion etching using an etching mask 2, a frame-shaped hole is formed in the silicon substrate 20 to obtain the silicon substrate 15 (FIGS. 10C-1 and 10C-2). Subsequently, the oxide layer 13 is removed by using BHF. By removing the oxide layer 13, an isolated silicon island 4, which has been bonded to the oxide layer 13, is also removed. Thus, a silicon substrate 19 having a hole 18 is made (FIGS. 5D-1 and 5D-2).

The method according to the present embodiment is effective in a case where it is necessary to support the isolated silicon island 4 on the silicon substrate 15 when reactive ion etching is finished and it is not necessary to provide an oxide layer in the substrate. With the method of making the silicon substrate 19, the silicon etching amount during reactive ion etching is reduced, and therefore the amount of heat generated during etching can be reduced and the resist can be removed without difficulty.

In each of the embodiments described above, the silicon etching amount when forming a through-hole or a hole that at least reaches an oxide layer in a substrate is reduced, and therefore the amount of heat generated during etching can be reduced and a resist can be removed without difficulty.

In each of the embodiments described above, a quadrangular through-hole is formed. However, this is not a limitation, and, for example, the present invention can be also applied to a case of forming a circular through-hole. In each of the embodiments described above, an example in which a liquid ejection head substrate is made from a substrate in which a through-hole is formed. However, this is not a limitation. For example, the present invention can be also applied to a method of making a micro electro mechanical system (MEMS) device or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-112001, filed May 30, 2014 and No. 2015-088301, filed Apr. 23, 2015, which are hereby incorporated by reference herein in their entirety.

What is claimed is:

1. A method of making a semiconductor substrate having a through-hole, comprising:

forming an etching mask on a surface of a semiconductor substrate in accordance with a pattern corresponding to the through-hole;

forming the through-hole by etching the semiconductor substrate, on which the etching mask has been formed, by reactive ion etching, wherein, viewing from a direction facing to the surface, the etching mask comprises a mask portion configured to mask the semiconductor substrate from the etching, and an opening corresponding to an inner edge of the through-hole, a part of the mask portion being located on an inner side of the opening, and the part of mask portion is not connected with the mask portion located outside of the opening by the etching mask, and is independent from the mask portion located outside of the opening; and removing an area of the semiconductor substrate masked by the part of the mask portion from the semiconductor substrate after the reactive ion etching.

2. The method according to claim 1, further comprising:

forming an etching stop layer on the semiconductor substrate; and removing the etching stop layer from the semiconductor substrate after the step of forming the through-hole, wherein, the removing the area of the semiconductor substrate masked by the part of mask portion from the semiconductor substrate is performed together with the removing the etching stop layer.

3. The method according to claim 1, further comprising:

if the surface is a first surface, and the etching mask is a first etching mask, forming the first etching mask on the first surface of the semiconductor substrate and forming a groove in the semiconductor substrate by etching the semiconductor substrate from the first surface by reactive ion etching;

forming an etching stop layer on the first surface in which the groove has been formed; and forming a second etching mask on a second surface opposite to the first surface and forming the through-hole by etching the semiconductor substrate from the second surface by reactive ion etching.

4. The method according to claim 1, wherein the opening having the part of the mask portion on the inner side is in a frame-like shape.

5. The method according to claim 1, wherein the etching mask has a plurality of openings corresponding to a plurality of through holes having different sizes, and the semiconductor substrate exposed on the inner sides of the openings has an equal line width.

6. A method of making a semiconductor substrate having a hole, comprising:

forming an etching mask on a surface of a semiconductor substrate in accordance with a pattern corresponding to the hole, the semiconductor substrate including an oxide layer disposed therein;

forming the hole by etching the semiconductor substrate, on which the etching mask has been formed, by reactive ion etching so that the hole extends at least to the oxide layer, wherein, viewing from a direction facing to the surface, the etching mask comprises a mask portion configured to mask the semiconductor substrate from the etching, and an opening corresponding to an inner edge of the hole, a part of the mask portion being located on an inner side of the opening, the part of mask portion is not connected with the mask portion located outside of the opening by the etching mask, and is independent from the mask portion located outside of the opening; and removing an area of the semiconductor substrate masked by the part of the mask portion from the semiconductor substrate after the reactive ion etching.

7. The method according to claim 6, further comprising:

forming an unbonded area at an interface between the oxide layer and the semiconductor substrate so as to correspond to a position at which the hole is to be formed before the step of forming the hole.

8. The method according to claim 6, further comprising:

removing at least a part of the oxide layer after forming the hole.

9. A method of making a liquid ejection head substrate, comprising:

preparing a circuit substrate on which an energy generating element for ejecting a liquid and a circuit are mounted;

forming a liquid channel in the circuit substrate;

forming an ejection port for ejecting the liquid in the circuit substrate; and forming a plurality of through-holes in the circuit substrate, wherein forming the through-holes includes forming an etching mask on a surface of the circuit substrate in accordance with a pattern corresponding to the through-holes, and forming the through-holes by etching the circuit substrate, on which the etching mask has been formed, by reactive ion etching, wherein, viewing from a direction facing to the surface, the etching mask comprises a mask portion configured to mask the circuit substrate from the etching, and a plurality of openings corresponding to inner edges of the through-holes, a part of the mask portion being located on at least one of inner sides of the openings, and the part of mask portion is not connected with the mask portion located outside of the opening by the etching mask, and is independent from the mask portion located outside of the opening; and removing an area of the semiconductor substrate masked by the part of the mask portion from the semiconductor substrate after the reactive ion etching.

10. The method according to claim 9, wherein the step of forming the through-holes includes forming an etching stop layer on the circuit substrate, and removing the etching stop layer from the circuit substrate after the forming of the through-holes, wherein the removing the area of the semiconductor substrate masked by the part of mask portion from the semiconductor substrate is performed together with the removing the etching stop layer.

11. The method according to claim 9, further comprising:

forming the first etching mask on the first surface of the circuit substrate and forming grooves in the circuit substrate by etching the circuit substrate from the first surface by reactive ion etching, if the surface is a first surface, and the etching mask is a first etching mask;

forming an etching stop layer on the first surface in which the grooves have been formed; and forming a second etching mask on a second surface opposite to the first surface and forming the through-holes by etching the circuit substrate from the second surface by reactive ion etching.

12. The method according to claim 9, wherein the at least one of the openings having the part of the mask portion on the inner sides is in a frame-like shape.

13. The method according to claim 9, wherein the etching mask has the plurality of openings corresponding to the plurality of through holes having different sizes, and the circuit substrate exposed on the inner sides of the openings has an equal line width.

14. A method of making a liquid ejection head substrate, comprising:

preparing a circuit substrate on which an energy generating element for ejecting a liquid and a circuit are mounted;

forming a liquid channel in the circuit substrate;

forming an ejection port for ejecting the liquid in the circuit substrate; and forming a plurality of holes in the circuit substrate, wherein the step of forming the holes includes forming an etching mask on a surface of the circuit substrate in accordance with a pattern corresponding to the holes, the circuit substrate including an oxide layer disposed therein, forming the holes by etching the circuit substrate, on which the etching mask has been formed, by reactive ion etching so the holes extend at least to the oxide layer, and wherein, viewing from a direction facing to the surface, the etching mask comprises a mask portion configured to mask the circuit substrate from the etching, and a plurality of openings corresponding to inner edges of the holes, a part of the mask portion being located on at least one of inner sides of the openings; and the part of mask portion is not connected with the mask portion located outside of the opening by the etching mask, and is independent from the mask portion located outside of the opening; and removing an area of the semiconductor substrate masked by the part of the mask portion from the semiconductor substrate after the reactive ion etching.

15. The method according to claim 14, further comprising:

forming, before the step of forming the holes, an unbonded area at an interface between the oxide layer and the circuit substrate so as to correspond to a position at which the holes are to be formed.

16. The method according to claim 14, further comprising:

removing at least a part of the oxide layer after the step of forming the holes.

* * * * *